US012581878B2

(12) United States Patent
Degai et al.

(10) Patent No.: US 12,581,878 B2
(45) Date of Patent: Mar. 17, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Motomu Degai, Toyama (JP); Kimihiko Nakatani, Toyama (JP); Yoshitomo Hashimoto, Toyama (JP); Takayuki Waseda, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 770 days.

(21) Appl. No.: 17/824,583

(22) Filed: May 25, 2022

(65) Prior Publication Data

US 2023/0058808 A1 Feb. 23, 2023

(30) Foreign Application Priority Data

Jul. 27, 2021 (JP) ................................ 2021-122751

(51) Int. Cl.
*H01L 21/02* (2006.01)
*C23C 16/02* (2006.01)
*C23C 16/52* (2006.01)

(52) U.S. Cl.
CPC .... *H01L 21/02359* (2013.01); *C23C 16/0236* (2013.01); *C23C 16/52* (2013.01)

(58) Field of Classification Search
None
See application file for complete search history.

(56) References Cited

U.S. PATENT DOCUMENTS

| | | | | |
|---|---|---|---|---|
| 11,855,192 | B2 * | 12/2023 | Lin | H10D 62/121 |
| 2010/0075508 | A1 | 3/2010 | Seino et al. | |
| 2014/0287596 | A1 | 9/2014 | Hirose et al. | |
| 2017/0200618 | A1 | 7/2017 | Hada et al. | |
| 2017/0342553 | A1 | 11/2017 | Yu et al. | |
| 2020/0185413 | A1 | 6/2020 | Kim et al. | |
| 2020/0258747 | A1 | 8/2020 | Narushima et al. | |
| 2020/0303185 | A1 | 9/2020 | Nakagawa et al. | |

(Continued)

FOREIGN PATENT DOCUMENTS

| | | | | |
|---|---|---|---|---|
| CN | 105934843 | B * | 12/2019 | C08L 29/10 |
| CN | 110943037 | A * | 3/2020 | H01L 21/0274 |

(Continued)

OTHER PUBLICATIONS

Taiwan Office Action issued on Jan. 31, 2023 for Taiwan Patent Application No. 111113838.

(Continued)

*Primary Examiner* — Michael Lebentritt
(74) *Attorney, Agent, or Firm* — Volpe Koenig

(57) ABSTRACT

There is provided a technique that includes (a) supplying a fluorine-containing gas to a substrate including a first surface and a second surface; (b) supplying an oxygen- and hydrogen-containing gas and a catalyst to the substrate after performing (a); (c) supplying a modifying agent to the substrate after performing (b); and (d) supplying a film-forming agent to the substrate after performing (c).

17 Claims, 7 Drawing Sheets

(56) References Cited

U.S. PATENT DOCUMENTS

| | | | |
|---|---|---|---|
| 2021/0035801 A1 | 2/2021 | Waseda et al. | |
| 2021/0104412 A1 | 4/2021 | Hada et al. | |
| 2021/0143001 A1 | 5/2021 | Ashihara et al. | |
| 2021/0159088 A1 | 5/2021 | Degai et al. | |
| 2021/0202245 A1 | 7/2021 | Waseda et al. | |
| 2021/0366706 A1 | 11/2021 | Nakatani | |
| 2022/0277955 A1 | 9/2022 | Waseda et al. | |

FOREIGN PATENT DOCUMENTS

| | | | | |
|---|---|---|---|---|
| CN | 111063690 A | | 4/2020 | |
| CN | 112838003 A | | 5/2021 | |
| EP | 4 080 548 A1 | | 10/2022 | |
| EP | 4124673 A1 | * | 2/2023 | ......... C23C 16/0236 |
| EP | 4343814 A1 | * | 3/2024 | ........... C23C 16/401 |
| JP | 2014-183218 A | | 9/2014 | |
| JP | 2017-126734 A | | 7/2017 | |
| JP | 2017-222928 A | | 12/2017 | |
| JP | 2020-128581 A | | 8/2020 | |
| JP | 2020-155452 A | | 9/2020 | |
| JP | 2020-155607 A | | 9/2020 | |
| JP | 2021-027067 A | | 2/2021 | |
| JP | 2021-106242 A | | 7/2021 | |
| KR | 2021-0021050 A | | 2/2021 | |
| TW | 202006169 A | | 2/2020 | |
| TW | 202101649 A | | 1/2021 | |
| WO | 2008/139621 A1 | | 11/2008 | |
| WO | 2020/016915 A1 | | 1/2020 | |
| WO | WO-2022054216 A1 | * | 3/2022 | ......... C23C 16/0272 |
| WO | WO-2022125231 A1 | * | 6/2022 | ........ H01J 37/32165 |
| WO | WO-2023047918 A1 | * | 3/2023 | ............. C23C 16/04 |

OTHER PUBLICATIONS

Korean Office Action issued on Feb. 24. 2023 for Korean Patent Application No. 10-2022-0064194.

Japanese Office Action issued on Feb. 14, 2023 for Japanese Patent Application No. 2021-122751.

Extended European Search Report issued on Nov. 18, 2022 for European Patent Application No. 22175384.1.

Singapore Search Report issued on Aug. 29, 2024 for Singapore Patent Application No. 10202205681T.

Singapore Written Opinion issued on Aug. 29, 2024 for Singapore Patent Application No. 10202205681T.

Japanese Office Action issued on Jun. 27, 2023 for Japanese Patent Application No. 2021-122751.

Chinese Office Action issued on Dec. 24, 2025 for Chinese Patent Application No. 202210487617.5.

* cited by examiner

| Step A | Step B | Step C | Step D | | | | Step E |

1st cycle   2nd cycle   nth cycle

Step D1
Step D2

Modifying agent

Precursor

O- and H-containing gas
(oxidizing agent)

Catalyst

Inert gas

F-containing gas

Processing temperature

Native oxide film

SiO     SiN

F  F  F  F  F

SiO     SiN

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-122751, filed on Jul. 27, 2021, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

As a process of manufacturing a semiconductor device, a process of selectively growing and forming a film on a specific surface among a plurality of types of surfaces in which materials exposed on the surface of a substrate are different (hereinafter, this process is also referred to as selective growth or selective film formation) may be often performed.

However, depending on the surface condition of the substrate before selective growth, it may be difficult to selectively grow the film on the specific surface among the plurality of types of surfaces.

SUMMARY

Some embodiments of the present disclosure provide a technique capable of selectively forming a film on a desired surface.

According to one embodiment of the present disclosure, there is provided a technique that includes (a) supplying a fluorine-containing gas to a substrate including a first surface and a second surface; (b) supplying an oxygen- and hydrogen-containing gas and a catalyst to the substrate after performing (a); (c) supplying a modifying agent to the substrate after performing (b); and (d) supplying a film-forming agent to the substrate after performing (c).

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

Hereinafter, one embodiment of the present disclosure will now be described mainly with reference to FIGS. 1 to 4 and 5A to 5E. The drawings used in the following description are all schematic, and the dimensional relationship, ratios, and the like of various elements shown in figures do not always match the actual ones. Further, even between the drawings, the dimensional relationship, ratios, and the like of various elements may not always match each other.

(1) Configuration of Substrate Processing Apparatus

Figure 1:
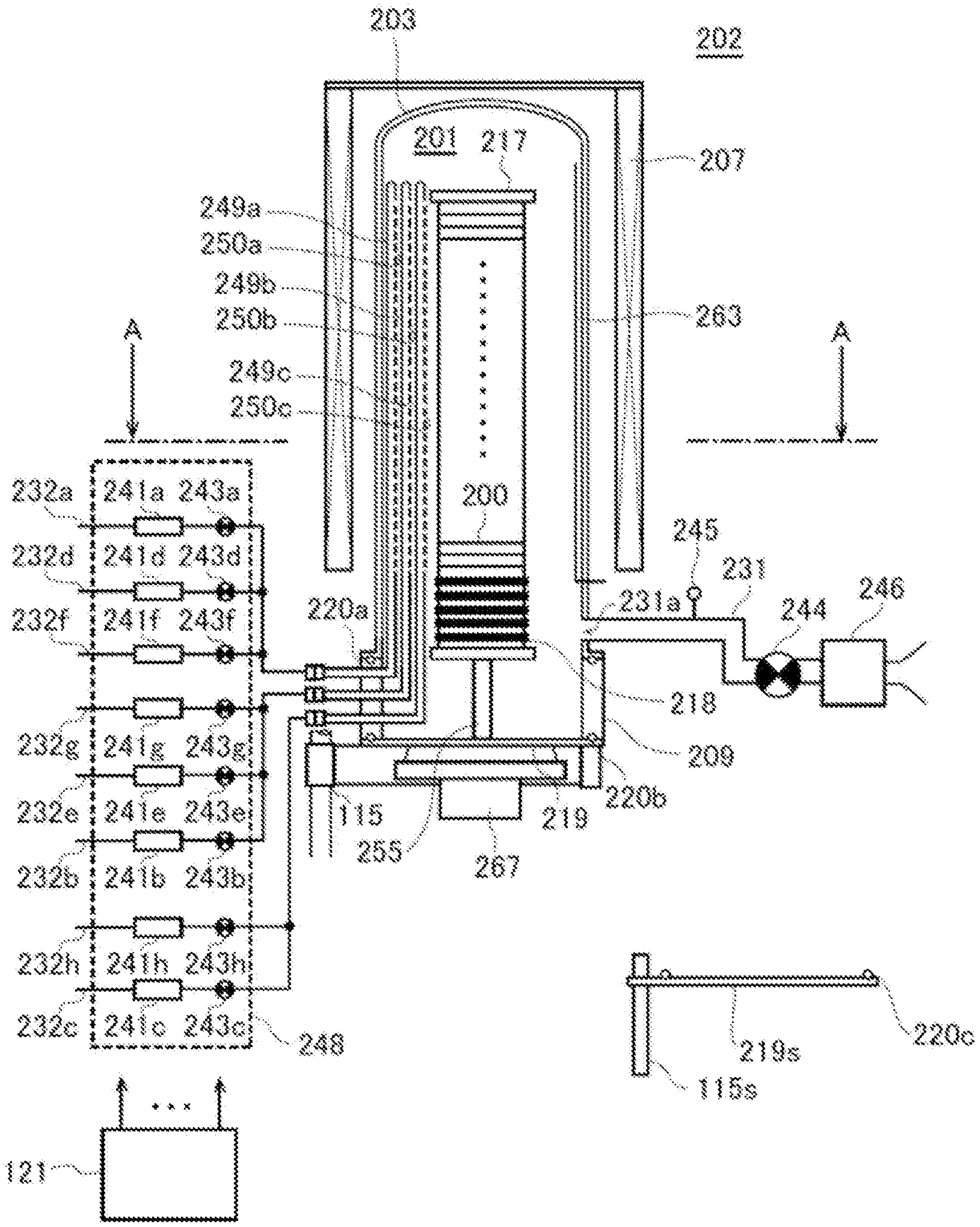
FIG. 1 is a schematic configuration view of a vertical process furnace of a substrate processing apparatus suitably used in an embodiment of the present disclosure, in which a portion of the process furnace 202 is shown in a vertical cross section.

As shown in FIG. 1, a process furnace 202 includes a heater 207 as a temperature regulator (a heating part). The heater 207 has a cylindrical shape and is vertically installed by being supported by a holder. The heater 207 also functions as an activation mechanism (an excitation part) configured to thermally activate (excite) a gas.

A reaction tube 203 is disposed inside the heater 207 to be concentric with the heater 207. The reaction tube 203 is composed of a heat resistant material such as, for example, quartz ($SiO_2$) or silicon carbide (SiC) or the like, and is formed in a cylindrical shape with its upper end thereof closed and its lower end thereof opened. Below the reaction tube 203, a manifold 209 is disposed to be concentric with the reaction tube 203. The manifold 209 is composed of a metal material such as, for example, stainless steel (SUS) or the like, and is formed in a cylindrical shape with both of its upper and lower ends thereof opened. The upper end portion of the manifold 209 engages with the lower end portion of the reaction tube 203 so as to support the reaction tube 203. An O-ring 220*a* as a seal member is installed between the manifold 209 and the reaction tube 203. Similar to the heater 207, the reaction tube 203 is vertically installed. A process container (reaction container) is mainly composed of the reaction tube 203 and the manifold 209. A process chamber 201 is formed in a hollow cylindrical portion of the process container. The process chamber 201 is configured to accommodate wafers 200 as substrates. Processing on the wafers 200 is performed in the process chamber 201.

Nozzles 249*a* to 249*c* as first to third supply parts are installed in the process chamber 201 so as to penetrate through a sidewall of the manifold 209. The nozzles 249*a* to 249*c* are also referred to as first to third nozzles, respectively. The nozzles 249*a* to 249*c* are composed of, for example, a heat resistant material such as quartz or SiC. Gas supply pipes 232*a* to 232*c* are connected to the nozzles 249*a* to 249*c*, respectively. The nozzles 249*a* to 249*c* are different nozzles, and each of the nozzles 249*a* and 249*c* is installed adjacent to the nozzle 249*b*.

Mass flow controllers (MFCs) 241*a* to 241*c*, which are flow rate controllers (flow rate control parts), and valves 243*a* to 243*c*, which are opening/closing valves, are installed in the gas supply pipes 232*a* to 232*c*, respectively, sequentially from the upstream side of a gas flow. Each of gas supply pipes 232*d* and 232*f* is connected to the gas supply pipe 232*a* at the downstream side of the valves 243*a*. Each of gas supply pipes 232*e* and 232*g* is connected to the gas supply pipe 232*b* at the downstream side of the valves 243*b*. A gas supply pipe 232*h* is connected to the gas supply pipe 232*c* at the downstream side of the valves 243*c*. MFCs 241*d* to 241*h* and valves 243*d* to 243*h* are installed in the gas supply pipes 232*d* to 232*h*, respectively, sequentially from the upstream side of a gas flow. The gas supply pipes 232*a* to 232*h* are composed of, for example, a metal material such as SUS.

Figure 2:
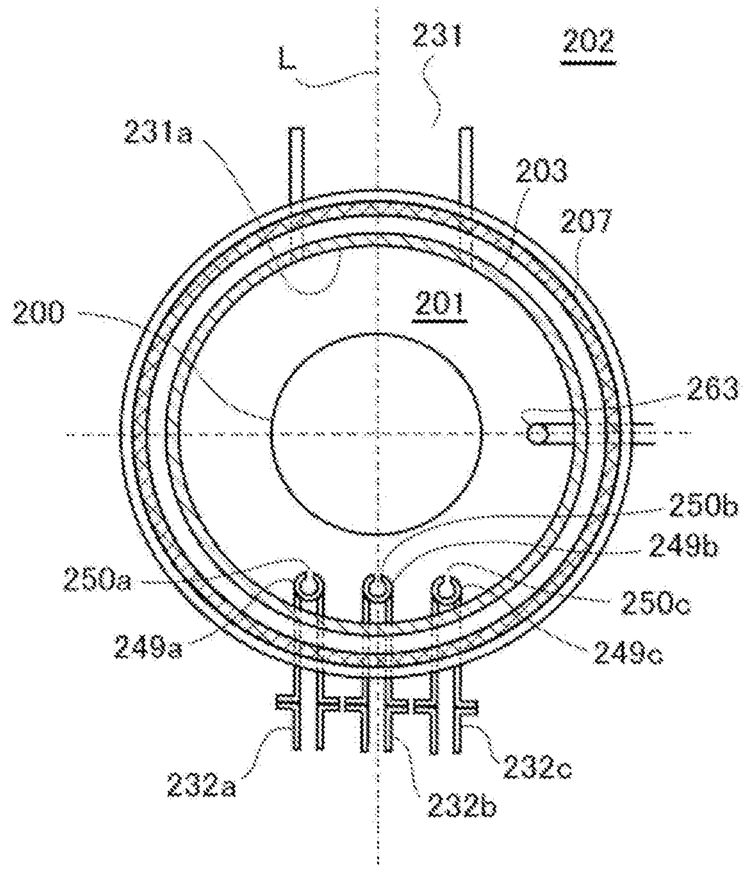
FIG. 2 is a schematic configuration view of the vertical process furnace of the substrate processing apparatus suitably used in the embodiment of the present disclosure, in which a portion of the process furnace 202 is shown in a cross section taken along line A-A in FIG. 1.

As shown in FIG. 2, each of the nozzles 249*a* to 249*c* is installed in an annular space (in a plane view) between an inner wall of the reaction tube 203 and the wafers 200 such that each of the nozzles 249*a* to 249*c* extends upward along an arrangement direction of the wafers 200 from a lower portion to an upper portion of the inner wall of the reaction tube 203. Specifically, each of the nozzles 249*a* to 249*c* is installed in a region horizontally surrounding a wafer arrangement region in which the wafers 200 are arranged at a lateral side of the wafer arrangement region, along the wafer arrangement region. In a plane view, the nozzle 249*b* is disposed to face an exhaust port 231*a* to be described later, on a straight line across the centers of the wafers 200 loaded into the process chamber 201, which are interposed therebetween. The nozzles 249*a* and 249*c* are arranged so as to sandwich a straight line L passing through the nozzle 249*b* and the center of the exhaust port 231*a* from both sides along the inner wall of the reaction tube 203 (the outer peripheral portion of the wafers 200). The straight line L is also a straight line passing through the nozzle 249*b* and the centers of the wafers 200. The nozzle 249*c* may installed on the side opposite to the nozzle 249*a* with the straight line L interposed therebetween. The nozzles 249*a* and 249*c* are arranged in line symmetry with the straight line L as an axis of symmetry. Gas supply holes 250*a* to 250*c* for supplying gases are formed on a side surfaces of the nozzles 249*a* to 249*c*, respectively. Each of the gas supply holes 250*a* to 250*c* is opened so as to oppose (face) the exhaust port 231*a* in a plane view, which enables a gas to be supplied toward the wafers 200. A plurality of gas supply holes 250*a* to 250*c* are formed from the lower portion of the reaction tube 203 to the upper portion thereof.

A modifying agent is supplied from the gas supply pipe 232*a* into the process chamber 201 via the MFC 241*a*, the valve 243*a*, and the nozzle 249*a*.

A precursor is supplied from the gas supply pipe 232*b* into the process chamber 201 via the MFC 241*b*, the valve 243*b*, and the nozzle 249*b*. The precursor is used as one of film-forming agents.

An oxygen (O)- and hydrogen (H)-containing gas is supplied from the gas supply pipe 232*c* into the process chamber 201 via the MFC 241*c*, the valve 243*c*, and the nozzle 249*c*. The O- and H-containing gas is used as an oxidizing agent which is one of the film-forming agents.

A catalyst is supplied from the gas supply pipe 232*d* into the process chamber 201 via the MFC 241*d*, the valve 243*d*, the gas supply pipe 232*a*, and the nozzle 249*a*. The catalyst is used as one of the film-forming agents.

A fluorine (F)-containing gas is supplied from the gas supply pipe 232*e* into the process chamber 201 via the MFC 241*e*, the valve 243*e*, the gas supply pipe 232*b*, and the nozzle 249*b*.

An inert gas is supplied from the gas supply pipes 232*f* to 232*h* into the process chamber 201 via the MFCs 241*f* to 241*h*, the valves 243*f* to 243*h*, the gas supply pipes 232*a* to 232*c*, and the nozzles 249*a* to 249*c*, respectively. The inert gas acts as a purge gas, a carrier gas, a dilution gas, or the like.

A modifying agent supply system mainly includes the gas supply pipe 232*a*, the MFC 241*a*, and the valve 243*a*. A precursor supply system mainly includes the gas supply pipe 232*b*, the MFC 241*b*, and the valve 243*b*. An O- and H-containing gas supply system mainly includes the gas supply pipe 232*c*, the MFC 241*c*, and the valve 243*c*. The O- and H-containing gas supply system is also referred to as an oxidizing agent supply system. A catalyst supply system mainly includes the gas supply pipe 232*d*, the MFC 241*d*, and the valve 243*d*. A F-containing gas supply system mainly includes the gas supply pipe 232*e*, the MFC 241*e*, and the valve 243*e*. An inert gas supply system mainly includes the gas supply pipes 232*f* to 232*h*, the MFCs 241*f* to 241*h*, and the valves 243*f* to 243*h*. Each or all of the precursor supply system, the oxidizing agent supply system, and the catalyst supply system are also referred to as a film-forming agent supply system.

Some or all of the above-described various supply systems may be configured as an integrated-type supply system 248 in which the valves 243*a* to 243*h*, the MFCs 241*a* to 241*h*, or the like are integrated. The integrated-type supply system 248 is configured to be connected to each of the gas supply pipes 232*a* to 232*h*. In addition, the integrated-type supply system 248 is configured such that operations of supplying various materials (various gases) into the gas supply pipes 232*a* to 232*h* (that is, the opening or closing operation of the valves 243*a* to 243*h*, the flow rate adjustment operation by the MFCs 241*a* to 241*h*, and the like) are controlled by a controller 121 which will be described later. The integrated-type supply system 248 is configured as an integral type or a division type integrated unit and may be attached to or detached from the gas supply pipes 232*a* to

232*h* and the like on an integrated unit basis, so that the maintenance, replacement, expansion, etc. of the integrated-type supply system 248 can be performed on the integrated unit basis.

The exhaust port 231*a* for exhausting an internal atmosphere of the process chamber 201 is installed below a sidewall of the reaction tube 203. As shown in FIG. 2, in a plane view, the exhaust port 231*a* is installed at a position opposing (facing) the nozzles 249*a* to 249*c* (the gas supply holes 250*a* to 250*c*) with the wafers 200 interposed therebetween. The exhaust port 231*a* may be installed from a lower portion of the sidewall of the reaction tube 203 to an upper portion thereof, that is, along the wafer arrangement region. An exhaust pipe 231 is connected to the exhaust port 231*a*. A vacuum pump 246 as a vacuum exhauster is connected to the exhaust pipe 231 via a pressure sensor 245, which is a pressure detector (pressure detection part) for detecting the internal pressure of the process chamber 201, and an auto pressure controller (APC) valve 244, which is a pressure regulator (pressure regulation part). The APC valve 244 is configured to perform or stop a vacuum exhausting operation in the process chamber 201 by opening or closing the valve in a state in which the vacuum pump 246 is operated, and is also configured to regulate the internal pressure of the process chamber 201 by adjusting an opening degree of the valve based on pressure information detected by the pressure sensor 245 in a state in which the vacuum pump 246 is operated. An exhaust system mainly includes the exhaust pipe 231, the APC valve 244, and the pressure sensor 245. The exhaust system may include the vacuum pump 246.

A seal cap 219 as a furnace opening lid capable of air-tightly closing a lower end opening of the manifold 209, is installed below the manifold 209. The seal cap 219 is composed of, for example, a metal material such as SUS, and is formed in a disc shape. An O-ring 220*b*, which is a seal in contact with a lower end of the manifold 209, is installed on an upper surface of the seal cap 219. A rotator 267 configured to rotate a boat 217, which will be described later, is installed below the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically raised or lowered by a boat elevator 115 which is an elevator installed outside the reaction tube 203. The boat elevator 115 is configured as a transfer device (transfer mechanism) which loads or unloads (transfers) the wafers 200 into and out of the process chamber 201 by raising or lowering the seal cap 219.

A shutter 219*s*, which serves as a furnace opening lid capable of air-tightly closing the lower end opening of the manifold 209 in a state where the seal cap 219 is lowered and the boat 217 is unloaded from the process chamber 201, is installed under the manifold 209. The shutter 219*s* is composed of, for example, a metal material such as SUS, and is formed in a disc shape. An O-ring 220*c*, which is a seal in contact with the lower end of the manifold 209, is installed on an upper surface of the shutter 219*s*. The opening/closing operation (such as the elevating operation, the rotating operation, or the like) of the shutter 219*s* is controlled by a shutter opener/closer 115*s*.

The boat 217 as a substrate support is configured to support a plurality of wafers 200, for example, 25 to 200 wafers 200, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is composed of a heat resistant material such as quartz or SiC. Heat insulating plates 218 composed of, for example, a heat resistant material such as quartz or SiC are supported in multiple stages at the bottom of the boat 217.

A temperature sensor 263 as a temperature detector is installed in the reaction tube 203. By adjusting a degree of conducting electricity of the heater 207 based on temperature information detected by the temperature sensor 263, the temperature inside the process chamber 201 becomes a desired temperature distribution. The temperature sensor 263 is installed along the inner wall of the reaction tube 203.

Figure 3:
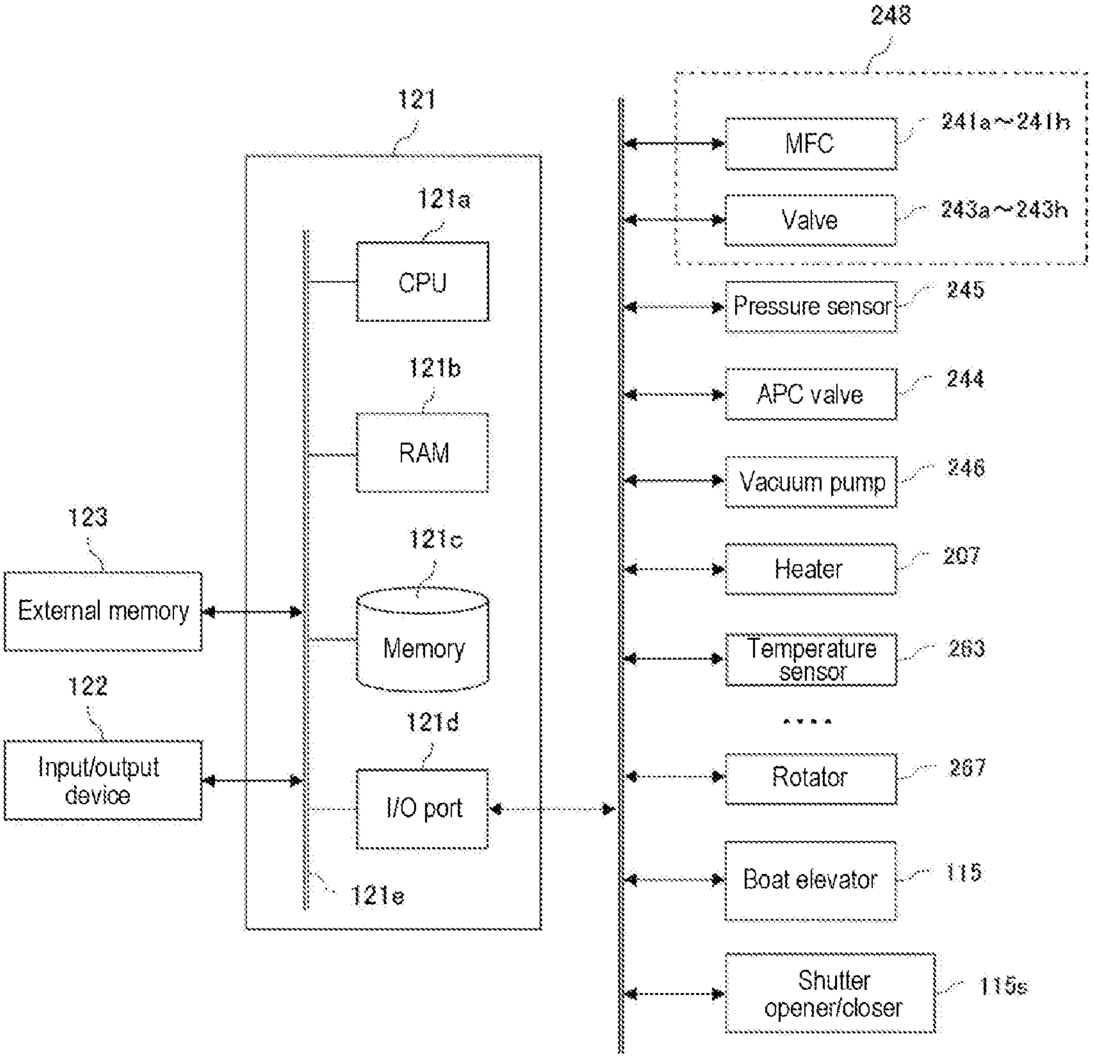
FIG. 3 is a schematic configuration diagram of a controller 121 of the substrate processing apparatus suitably used in the embodiment of the present disclosure, in which a control system of the controller 121 is shown in a block diagram.

As shown in FIG. 3, a controller 121, which is a control part (control means), is configured as a computer including a CPU (Central Processing Unit) 121*a*, a RAM (Random Access Memory) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 configured as, e.g., a touch panel or the like, is connected to the controller 121. Further, an external memory 123 can be connected to the controller 121.

The memory 121*c* is configured by, for example, a flash memory, a HDD (Hard Disk Drive), a SSD (Solid State Drive) or the like. A control program for controlling operations of a substrate processing apparatus, a process recipe in which sequences and conditions of substrate processing to be described below, etc. are readably stored in the memory 121*c*. The process recipe is a combination for causing, by the controller 121, the substrate processing apparatus to execute respective procedures in the substrate processing, which will be described later, to obtain an expected result. The process recipe functions as a program. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121*b* is configured as a memory area (work area) in which programs or data read by the CPU 121*a* are temporarily stored.

The I/O port 121*d* is connected to the MFCs 241*a* to 241*h*, the valves 243*a* to 243*h*, the pressure sensor 245, the APC valve 244, the vacuum pump 246, the temperature sensor 263, the heater 207, the rotator 267, the boat elevator 115, the shutter opener/closer 115*s*, and so on.

The CPU 121*a* is configured to read and execute the control program from the memory 121*c*. The CPU 121*a* is also configured to read the recipe from the memory 121*c* according to an input of an operation command from the input/output device 122. In addition, the CPU 121*a* is configured to be capable of control, according to the contents of the read recipe, the flow rate adjusting operation of various kinds of materials (gases) by the MFCs 241*a* to 241*h*, the opening/closing operation of the valves 243*a* to 243*h*, the opening/closing operation of the APC valve 244, the pressure-regulating operation performed by the APC valve 244 based on the pressure sensor 245, the actuating and stopping operation of the vacuum pump 246, the temperature-regulating operation performed by the heater 207 based on the temperature sensor 263, the rotation and the rotation speed adjustment operation of the boat 217 by the rotator 267, the raising or lowering operation of the boat 217 by the boat elevator 115, the opening/closing operation of the shutter 219*s* by the shutter opener/closer 115*s*, and the like.

The controller 121 may be configured by installing, on the computer, the aforementioned program stored in an external memory 123. Examples of the external memory 123 may include a magnetic disk such as a HDD, an optical disc such as a CD or the like, a magneto-optical disc such as a MO or the like, a semiconductor memory such as a USB memory or a SSD, and the like. The memory 121*c* or the external memory 123 is configured as a computer-readable recording medium. Hereinafter, the memory 121*c* and the external memory 123 may be collectively and simply referred to as a "recording medium." When the term "recording medium" is used herein, it may indicate a case of including the memory 121*c* only, a case of including the external memory 123 only, or a case of including both the memory 121*c* and the external memory 123. Furthermore, the program may be provided to the computer using communication means such as the Internet or a dedicated line, instead of using the external memory 123.

(2) Substrate Processing Process

As a process of manufacturing a semiconductor device using the above-described substrate processing apparatus, an example of a method of processing a substrate, that is, a processing sequence for selectively forming a film on a second surface among a first surface and the second surface of a wafer 200 as a substrate, will be described mainly with reference to FIGS. 4 and 5A to 5E. In the following description, for the sake of convenience, a case where the first surface is formed of a SiO film and the second surface is formed of a SiN film will be described as a typical example of the wafer 200. In the following descriptions, the operations of the respective parts constituting the substrate processing apparatus are controlled by the controller 121.

Figure 4:
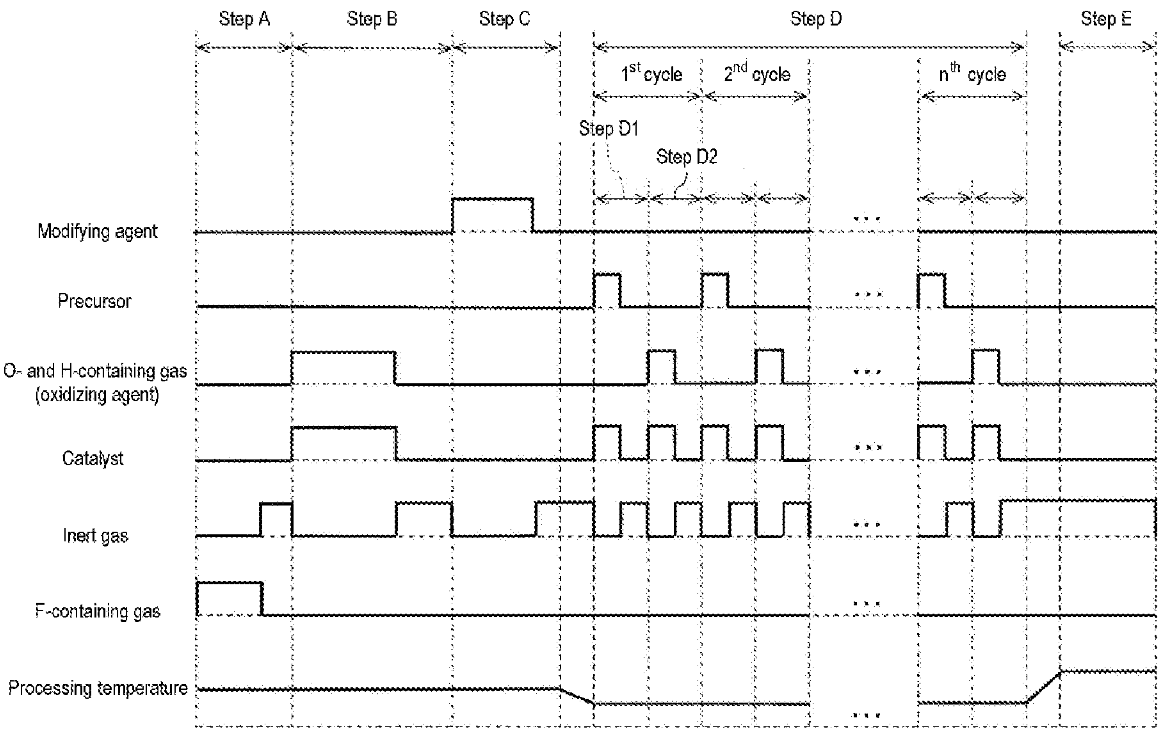
FIG. 4 is a diagram showing a processing sequence according to an embodiment of the present disclosure.

A processing sequence shown in FIG. 4 includes:

step A of supplying a F-containing gas to a wafer 200 having a first surface and a second surface;

step B of supplying an O- and H-containing gas and a catalyst to the wafer 200 after performing step A;

step C of supplying a modifying agent to the wafer 200 after performing step B; and step D of supplying a film-forming agent to the wafer 200 after performing step C.

As shown in FIG. 4, step D includes:

performing a cycle a predetermined number of times (n times, where n is an integer of 1 or more), the cycle including non-simultaneously performing:

step D1 of supplying a precursor as the film-forming agent to the wafer 200; and step D2 of supplying an oxidizing agent as the film-forming agent to the wafer 200.

In at least one of step D1 and step D2, the catalyst may be further supplied as the film-forming agent to the wafer 200. FIG. 4 shows an example of further supplying the catalyst as the film-forming agent to the wafer 200 in each of step D1 and step D2.

Further, the processing sequence shown in FIG. 4 shows an example of further including step E of performing heat treatment on the wafer 200 after performing step D.

Further, the processing sequence shown in FIG. 4 shows an example in which the processing temperatures in steps A, B, and C (including the processing temperature at the time of purging) are all the same temperature, the processing temperature in step D is set lower than the processing temperature in steps A, B, and C, and the processing temperature in step E is set higher than the processing temperatures in steps A, B, and C. From the viewpoint of improving productivity, the processing temperatures in steps A, B, C, and D may all be set to the same temperature. The term "same temperature" used in the present disclosure means a temperature within ±5 degrees C. For example, "the processing temperature in step A may be set to the same as the processing temperature in step B" means that the processing temperature in step A may be set to within ±5 degrees C. with respect to the processing temperature in step B.

In the present disclosure, for the sake of convenience, the above-described processing sequence may be denoted as follows. The same denotation may be used in modifications and other embodiments to be described later.

F-containing gas→O- and H-containing gas+Catalyst→Modifying agent→(Precursor+Catalyst Oxidizing agent+Catalyst)×$n$→Heat treatment When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

The term "agent" used in the present disclosure includes at least one selected from the group of a gaseous substance and a liquefied substance. The liquefied substance includes a misty substance. That is, each of the modifying agent and the film-forming agent (precursor, oxidizing agent or catalyst) may include a gaseous substance, a liquefied substance such as a misty substance, or both of them.

The term "layer" used in the present disclosure includes at least one selected from the group of a continuous layer and a discontinuous layer. For example, a film-formation inhibiting layer may include a continuous layer, a discontinuous layer, or both of them as long as it is possible to cause a film-formation inhibiting action.

(Wafer Charging and Boat Loading)

After the boat 217 is charged with a plurality of wafers 200 (wafer charging), the shutter 219*s* is moved by the shutter opener/closer 115*s* and the lower end opening of the manifold 209 is opened (shutter open). Thereafter, as shown in FIG. 1, the boat 217 charged with the plurality of wafers 200 is lifted by the boat elevator 115 to be loaded into the process chamber 201 (boat loading). In this state, the seal cap 219 seals the lower end of the manifold 209 through the O-ring 220*b*.

Figure 5A:
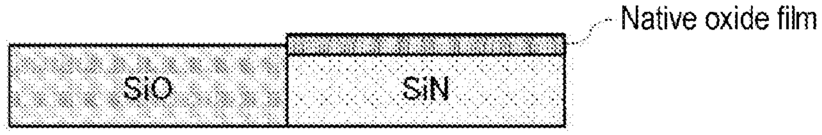
FIG. 5A is a schematic cross-sectional view showing a wafer surface portion including a first surface formed of a silicon oxide film (SiO film) and a second surface formed of a silicon nitride film (SiN film), with a native oxide film formed on the surface of the SiN film.

Further, as shown in FIG. 5A, the wafer 200 which is charged to the boat 217 includes a SiO film constituting the first surface and a SiN film constituting the second surface. That is, the surface of the SiO film becomes the first surface, and the surface of the SiN film becomes the second surface. Further, as shown in FIG. 5A, a native oxide film is formed on the surface of the SiN film constituting the second surface of the wafer 200. The SiO film constituting the first surface is an oxide film such as, for example, a thermal oxide film or an oxide film formed by a chemical vapor deposition method, and has higher film density and more strong Si—O bonds than the native oxide film.

(Pressure Regulation and Temperature Regulation)

The inside of the process chamber 201, that is, a space where the wafers 200 exists, is vacuum-exhausted (decompression-exhausted) by the vacuum pump 246 to reach a desired pressure (vacuum degree). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to reach a desired temperature. At this time, the degree of conducting electricity of the heater 207 is feedback-controlled based on the temperature information detected by the temperature sensor 263 so that the inside of the process chamber 201 set to a desired temperature distribution. Further, the rotation of the wafers 200 by the rotator 267 is started. The exhaust of the inside of the process chamber 201 and the heating and rotation of the wafers 200 are continuously performed at least until the processing on the wafers 200 is completed.

Step A

After that, the F-containing gas is supplied to the wafer 200.

Specifically, the valve 243*e* is opened to allow the F-containing gas to flow into the gas supply pipe 232*e*. The flow rate of the F-containing gas is adjusted by the MFC 241*e*, and the F-containing gas is supplied into the process chamber 201 via the gas supply pipe 232*b* and the nozzle 249*b* and is exhausted through the exhaust port 231*a*. In this operation, the F-containing gas is supplied to the wafer 200 from the side of the wafer 200 (F-containing gas supply). At this time, the valves 243*f* to 243*h* may be opened to allow an inert gas to be supplied into the process chamber 201 via the nozzles 249*a* to 249*c*, respectively.

Figure 5B:
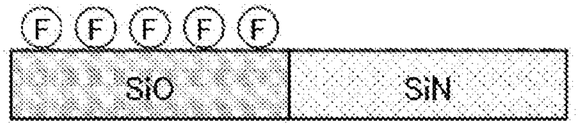
FIG. 5B is a schematic cross-sectional view showing the wafer surface portion after the native oxide film is removed from the surface of the SiN film and fluorine (F) is adsorbed on the surface of the SiO film by performing step A from the state of FIG. 5A.

By supplying the F-containing gas to the wafer 200 under the process conditions to be described later, the native oxide film formed on the surface of the SiN film, which is the second surface, can be selectively removed (etched) to expose the surface of the SiN film, as shown in FIG. 5B. At this time, fluorine (F) is adsorbed and remains on the surface of the SiO film which is the first surface.

In this step, a portion of the surface of the SiO film may be etched very slightly, but as described above, since the SiO film has higher film density and more strong Si—O bonds than the native oxide film, an etching amount (removal amount) of the SiO film is much smaller than an etching amount (removal amount) of the native oxide film. Therefore, even in this case, it is possible to effectively remove the native oxide film while suppressing the removal amount (etching amount) of the SiO film to a small amount. Further, in this step, F may be slightly adsorbed (remained) on a portion of the surface of the SiN film, but an amount and a density of F adsorbed on the surface of the SiN film are much smaller than an amount and a density of F adsorbed on the surface of the SiO film. Therefore, even in this case, the influence of F adsorbed on the surface of the SiN film is extremely small.

The process conditions for supplying the F-containing gas in step A are exemplified as follows.

Processing temperature: 50 to 200 degrees C., specifically 70 to 150 degrees C.

Processing pressure: 10 to 2,000 Pa, specifically 100 to 1,500 Pa

F-containing gas supply flow rate: 0.05 to 1 slm, specifically 0.1 to 0.5 slm

F-containing gas supply time: 10 to 60 minutes, specifically 30 to 60 minutes

Inert gas supply flow rate (for each gas supply pipe): 1 to 10 slm, specifically 2 to 10 slm In the present disclosure, the notation of a numerical range such as "50 to 200 degrees C." means that the lower limit value and the upper limit value are included in the range. Therefore, for example, "50 to 200 degrees C." means "50 degrees C. or higher and 200 degrees C. or lower." The same applies to other numerical ranges. In the present disclosure, the processing temperature means the temperature of the wafer 200 or the internal temperature of the process chamber 201, and the processing pressure means the internal pressure of the process chamber 201. Further, the gas supply flow rate of 0 slm means a case where no substance (gas) is supplied. These apply equally to the following description.

After removing the native oxide film from the surface of the SiN film which is the second surface to expose the surface of the SiN film, the valve 243*e* is closed to stop the supply of the F-containing gas into the process chamber 201. Then, the interior of the process chamber 201 is vacuum-exhausted to remove a gaseous substance and the like remaining in the process chamber 201 from the interior of the process chamber 201. At this time, the valves 243*f* to 243*h* are opened to allow an inert gas to be supplied into the process chamber 201 via the nozzles 249*a* to 249*c*. The inert gas supplied from the nozzles 249*a* to 249*c* acts as a purge gas, whereby the interior of the process chamber 201 is purged (purging). The processing temperature for purging in this step may be set to the same as the processing temperature for supplying the F-containing gas.

The process conditions for purging in step A are exemplified as follows.

Processing pressure: 1 to 30 Pa

Inert gas supply flow rate (for each gas supply pipe): 0.5 to 20 slm

Inert gas supply time: 1 to 120 seconds, specifically 1 to 60 seconds

The processing temperature for purging in this step may be set to the same as the processing temperature for supplying the F-containing gas.

As the F-containing gas, for example, chlorine trifluoride ($ClF_3$) gas, chlorine fluoride (ClF) gas, nitrogen trifluoride ($NF_3$) gas, hydrogen fluoride (HF) gas, fluorine ($F_2$) gas, or the like can be used. One or more of these gases can be used as the F-containing gas.

As the inert gas, nitrogen ($N_2$) gas or a rare gas such as argon (Ar) gas, helium (He) gas, neon (Ne) gas, or xenon (Xe) gas can be used. One or more of these gases can be used as the inert gas. This point is the same in each step to be described later.

Step B

After performing step A, the O- and H-containing gas and the catalyst are supplied to the wafer 200.

Specifically, the valves 243*c* and 243*d* are opened to allow the O- and H-containing gas and the catalyst to flow into the gas supply pipes 232*c* and 232*d*, respectively. The flow rates of the O- and H-containing gas and the catalyst are adjusted by the MFCs 241*c* and 241*d*, respectively, and the O- and H-containing gas and the catalyst are supplied into the process chamber 201 via the nozzles 249*c* and 249*a*, respectively, and are exhausted through the exhaust port 231*a*. In this operation, the O- and H-containing gas and the catalyst are supplied to the wafer 200 from the side of the wafer 200 (O- and H-containing gas+catalyst supply). At this time, the valves 243*f* to 243*h* may be opened to allow an inert gas to be supplied into the process chamber 201 via the nozzles 249*a* to 249*c*, respectively.

Figure 5C:
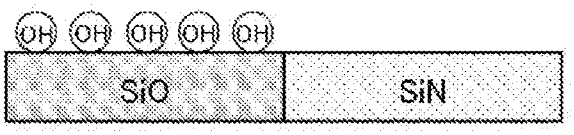
FIG. 5C is a schematic cross-sectional view showing the wafer surface portion after F adsorbed on the surface of the SiO film is substituted with a hydroxyl group (OH) by performing step B from the state of FIG. 5B.

By supplying the O- and H-containing gas and the catalyst to the wafer 200 under the process conditions to be described later, F adsorbed on the surface of the wafer 200 (specifically, the surface of the SiO film) can be removed and an OH termination can be formed on the surface of the SiO film which is the first surface, as shown in FIG. 5C. In other words, by supplying the O- and H-containing gas and the catalyst to the wafer 200 under the process conditions to be described later, F adsorbed on the surface of the SiO film is substituted with OH. The reaction in which F adsorbed on the surface of the SiO film is substituted with OH can be shown by, for example, the following reaction formula. Here, the following reaction formula shows an example in which water vapor ($H_2O$ gas) is used as the O- and H-containing gas and pyridine ($C_5H_5N$, abbreviation: Py) gas is used as the catalyst.

[Chemical Formula 1]

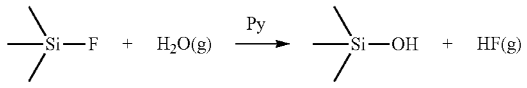

As shown in the above reaction formula, a "Si—F bond" existing on the surface of the SiO film on which F is adsorbed is substituted with a "Si—OH bond" by the $H_2O$ gas in the presence of pyridine. Further, F desorbed from the "Si—F bond" is bonded to H derived from the $H_2O$ gas to become hydrogen fluoride (HF) gas.

In this step, the above-mentioned reaction can be generated, so that the OH termination can be effectively formed on the surface of the SiO film. Since the O- and H-containing gas acts as an oxidizing agent, in this step, the OH termination can be formed on the surface of the SiO film by oxidizing the surface of the SiO film on which F is adsorbed. Further, in this step, by supplying the O- and H-containing gas and the catalyst, not only F adsorbed on the surface of the SiO film but also F adsorbed on another surface can be removed. That is, in this step, it is possible to remove F adsorbed on the surface of the wafer 200 (including the surface of the SiO film, the surface of the SiN film, and other surfaces).

Further, by supplying the O- and H-containing gas and the catalyst to the wafer 200 under the process conditions to be described later, it is possible to suppress the oxidation of the surface of the SiN film and the formation of the OH termination on the surface of the SiN film. This is because the process conditions to be described later are process conditions where F adsorbed on the surface of the wafer 200 can be removed and the OH termination can be formed on the surface of the SiO film, but oxidizing power is relatively small (weakened) so that the oxidation of the surface of the SiN film and the formation of the OH termination on the surface of the SiN film are suppressed. As a result, in this step, it is possible to selectively form the OH termination on the surface of the SiO film. By selectively forming the OH termination on the surface of the SiO film in this way, the OH termination functions as an adsorption site, which can promote the adsorption of the modifying agent on the surface of the SiO film in step C.

In this step, a slight amount of OH termination may be formed on a portion of the surface of the SiN film, but an amount and a density of OH termination formed on the surface of the SiN film are much smaller than an amount and a density of OH termination formed on the surface of the SiO film. Therefore, even in this case, the influence of the OH termination formed on the surface of the SiN film is extremely small.

As described above, this step may be performed under the condition that the formation of the OH termination on the surface of the SiN film is suppressed and the OH termination is formed on the surface of the SiO film. Further, as described above, this step may be performed under the condition that the oxidation of the surface of the SiN film is suppressed and the OH termination is formed on the surface of the SiO film. Further, as described above, this step may be performed under the condition that the amount of OH termination formed on the surface of the SiN film is smaller than the amount of OH termination formed on the surface of the SiO film. By performing step B under these conditions, the OH termination can be selectively formed on the surface of the SiO film among the SiO film and the SiN film, which makes it possible to selectively adsorb the modifying agent on the surface of the SiO film in step C.

The process conditions for supplying the O- and H-containing gas and the catalyst in step B are exemplified as follows.

Processing temperature: 30 to 150 degrees C., specifically 50 to 100 degrees C.

Processing pressure: 665 to 26,600 Pa, specifically 931 to 13,300 Pa, more specifically 931 to 1,330 Pa O- and H-containing gas supply flow rate: 0.1 to 3 slm, specifically 0.1 to 1 slm O- and H-containing gas supply time: 0.5 to 5 hours, specifically 0.5 to 3 hours Catalyst supply flow rate: 0.1 to 3 slm, specifically 0.1 to 1 slm Inert gas supply flow rate (for each gas supply pipe): 0 to 10 slm In this step, by using the catalyst together with the O- and H-containing gas, the substitution rate (oxidation rate) of F on the surface of the SiO film with OH can be increased at low temperature and low pressure. On the other hand, the supply of the catalyst can be omitted by increasing at least one selected from the group of the processing pressure and the processing temperature. That is, even when only the O- and H-containing gas is supplied as a reactive gas to the wafer 200 without supplying the catalyst, F adsorbed on the surface of the SiO film can be substituted with OH by increasing at least one selected from the group of the processing pressure and the processing temperature. In that case, for example, the processing pressure may be set equal to or higher than the processing pressure in step D2 to be described later, specifically higher than the processing pressure in step D2. Further, for example, the processing temperature may be set equal to or higher than the processing temperature in step D2 to be described later, specifically higher than the processing temperature in step D2. In this case, specifically, the processing pressure may be set to, for example, 13,300 to 66,500 Pa, specifically 19,950 to 39,900 Pa. Further, in this case, the processing temperature may be set to, for example, 50 to 200 degrees C., specifically 70 to 150 degrees C. Other process conditions may be set to the same as the above-mentioned process conditions.

After forming the OH termination on the surface of the SiO film which is the first surface, the valves 243*c* and 243*d* are closed to stop the supply of the O- and H-containing gas and the catalyst into the process chamber 201. Then, a gaseous substance and the like remaining in the process chamber 201 are removed from the process chamber 201 (purging) according to the same processing procedure and process conditions as in the purging in step A. The processing temperature for purging in this step may be set to the same as the processing temperature for supplying the O- and H-containing gas and the catalyst.

Examples of the O- and H-containing gas may include $H_2O$ gas, hydrogen peroxide ($H_2O_2$) gas, hydrogen ($H_2$) gas+oxygen ($O_2$) gas, $H_2$ gas+ozone ($O_3$) gas, and the like. One or more of these gases can be used as the O- and H-containing gas.

In the present disclosure, the description of two gases such as "$H_2$ gas+$O_2$ gas" together means a mixed gas of $H_2$ gas and $O_2$ gas. When supplying the mixed gas, the two gases may be mixed (pre-mixed) in a supply pipe and then supplied into the process chamber 201, or the two gases may be supplied separately from different supply pipes into the process chamber 201 and then mixed (post-mixed) in the process chamber 201.

As the catalyst, for example, an amine-based gas containing carbon (C), nitrogen (N), and H can be used. Examples of the amine-based gas may include a cyclic amine-based gas such as pyridine (Py) gas, aminopyridine ($C_5H_6N_2$) gas, picoline ($C_6H_7N$) gas, rutidine ($C_7H_9N$) gas, piperazine ($C_4H_{10}N_2$) gas, or piperidine ($C_5H_{11}N$) gas, a chain amine-based gas such as triethylamine ($(C_2H_5)_3N$, abbreviation: TEA) gas or diethylamine ($(C_2H_5)_2NH$, abbreviation: DEA) gas, or the like. In addition to these, for example, ammonia ($NH_3$) gas or the like can be used as the catalyst. One or more of these gases can be used as the catalyst. This point is the same in step D to be described later.

Step C

After performing step B, a modifying agent is supplied to the wafer 200.

Specifically, the valve 243*a* is opened to allow the modifying agent to flow into the gas supply pipe 232*a*. The flow rate of the modifying agent is adjusted by the MFC 241*a*, and the modifying agent is supplied into the process chamber 201 via the nozzle 249*a* and is exhausted through the exhaust port 231*a*. In this operation, the modifying agent is supplied to the wafer 200 from the side of the wafer 200 (modifying agent supply). At this time, the valves 243*f* to 243*h* may be opened to allow an inert gas to be supplied into the process chamber 201 via the nozzles 249*a* to 249*c*, respectively.

Figure 5D:
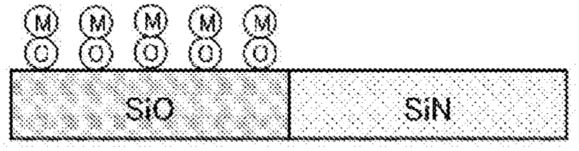
FIG. 5D is a schematic cross-sectional view showing the wafer surface portion after at least a portion (M) of the molecular structure of molecules constituting a modifying agent is bonded to the surface of the SiO film by performing step C from the state of FIG. 5C.

By supplying the modifying agent to the wafer 200 under the process conditions to be described later, at least a portion of the molecular structure of molecules constituting the modifying agent can be adsorbed on the surface of the SiO film, that is, the OH termination formed on the surface of the SiO film which is the first surface, so that the surface of the SiO film can be modified so as to form a film-formation inhibiting layer. That is, in this step, by supplying the modifying agent reacting with the OH termination to the wafer 200, at least a portion of the molecular structures of the molecules constituting the modifying agent can be adsorbed on the surface of the SiO film on which the OH termination is formed, so that the surface of the SiO film can be modified so as to form the film-formation inhibiting layer (adsorption inhibitor layer). This makes it possible to terminate the outermost surface of the SiO film with at least a portion (M) of the molecular structure of the molecules constituting the modifying agent, as shown in FIG. 5D. That is, as shown in FIG. 5D, the outermost surface of the SiO film on the wafer 200 after performing this step is terminated with a group (OM) in which O of the OH termination is bonded to at least the portion (M) of the molecular structure of the molecules constituting the modifying agent.

The film-formation inhibiting layer formed in this step contains at least the portion (M) of the molecular structure of the molecules constituting the modifying agent, which is a residue derived from the modifying agent. In step D to be described later, the film-formation inhibiting layer prevents the adsorption of the precursor (film-forming agent) on the surface of the SiO film and inhibits (suppresses) the progress of a film-forming reaction on the surface of the SiO film.

As at least the portion (M) of the molecular structure of the molecules constituting the modifying agent, for example, a trialkylsilyl group such as a trimethylsilyl group (—$SiMe_3$) or a triethylsilyl group (—$SiEt_3$) can be exemplified. In these cases, Si of the trimethylsilyl group or the triethylsilyl group is bonded to O of the OH termination, so that the outermost surface of the SiO film is terminated by an alkyl group such as a methyl group or an ethyl group. The alkyl group (alkylsilyl group) such as the methyl group (trimethylsilyl group) or the ethyl group (triethylsilyl group), which terminates the outermost surface of the SiO film, constitutes the film-formation inhibiting layer which prevents the adsorption of the precursor (film-forming agent) on the surface of the SiO film to inhibit (suppress) the progress of the film-forming reaction on the surface of the SiO film in step D to be described later.

Here, the film-formation inhibiting layer (also referred to as a film-forming suppression layer) may be referred to as an inhibitor because it has a film-formation inhibiting action. In addition, the term "inhibitor" used in the present disclosure may mean not only a film-formation inhibiting layer, but also a modifying agent and a residue derived from the modifying agent, for example, at least a portion of the molecular structure of molecules constituting the modifying agent, and further may mean to be used as the general term for all of them.

In this step, at least a portion of the molecular structure of the molecules constituting the modifying agent may be adsorbed on a portion of the surface of the SiN film which is the second surface, but the amount of adsorption thereof is small and the amount of adsorption on the surface of the SiO film, which is the first surface, is overwhelmingly large. Such selective (preferential) adsorption is possible because the process conditions in this step are the conditions that the modifying agent does not undergo gas phase decomposition in the process chamber 201. This is also possible because the surface of the SiO film is OH-terminated over the entire region, whereas many regions on the surface of the SiN film are not OH-terminated. In this step, since the modifying agent does not undergo the gas phase decomposition in the process chamber 201, at least a portion of the molecular structure of the molecules constituting the modifying agent is not multiple-deposited on the surface of the SiN film, and at least a portion of the molecular structure of the molecules constituting the modifying agent is selectively adsorbed on the surface of the SiO film among the SiO film and the SiN film, whereby the surface of the SiO film is selectively terminated by at least the portion (M) of the molecular structure of the molecules constituting the modifying agent.

The process conditions for supplying the modifying agent in step C are exemplified as follows.

Processing temperature: room temperature (25 degrees C.) to 500 degrees C., specifically room temperature to 250 degrees C.

Processing pressure: 5 to 2,000 Pa, specifically 10 to 1,000 Pa

Modifying agent supply flow rate: 0.001 to 3 slm, specifically 0.001 to 0.5 slm

Modifying agent supply time: 1 second to 120 minutes, specifically 30 seconds to 60 minutes Inert gas supply flow rate (for each gas supply pipe): 0 to 20 slm After selectively forming the film-formation inhibiting layer on the surface of the SiO film which is the first surface, the valve 243*a* is closed to stop the supply of the modifying agent into the process chamber 201. Then, a gaseous substance and the like remaining in the process chamber 201 are removed from the process chamber 201 (purging) according to the same processing procedure and process conditions as in the purging in step A. The processing temperature for purging in this step may be set to the same as the processing temperature for supplying the modifying agent.

As the modifying agent, for example, a substance containing one or more atoms to which a first functional group and a second functional group are directly bonded in one molecule can be used. The first functional group in the modifying agent may be a functional group capable of chemically adsorbing the modifying agent to an adsorption site (for example, an OH termination) on the first surface (for example, the surface of the SiO film). The first functional group may contains an amino group, specifically a substituted amino group. When the modifying agent contains the amino group (specifically the substituted amino group), the amount of chemical adsorption of the modifying agent on the first surface can be increased. In particular, from the viewpoint of the adsorptivity on the first surface, all the first functional groups of the modifying agent may be substituted amino groups.

As a substituent contained in the substituted amino group, an alkyl group may be used; specifically, an alkyl group including 1 to 5 carbon atoms may be used; more specifically, an alkyl group including 1 to 4 carbon atoms may be used. The alkyl group contained in the substituted amino group may be linear or branched. Examples of the alkyl group contained in the substituted amino group may include a methyl group, an ethyl group, an n-propyl group, an n-butyl group, an isopropyl group, an isobutyl group, a sec-butyl group, a tert-butyl group, and the like. The number of substituents contained in the substituted amino group may be 1 or 2, specifically 2. When the number of substituents contained in the substituted amino group is 2, the two substituents may be the same or different.

The number of first functional groups in the modifying agent may be 2 or less, more specifically 1. When the modifying agent contains a plurality of first functional groups, they may be the same or different.

The second functional group in the modifying agent may be a functional group capable of modifying the outermost surface of the first surface into a film-formation inhibiting region. The second functional group may be a chemically stable functional group, more specifically a hydrocarbon group. The hydrocarbon group may be an aliphatic hydrocarbon group such as an alkyl group, an alkenyl group, or an alkynyl group, or may be an aromatic hydrocarbon group. Among these, the alkyl group may be selected for the hydrocarbon group. In particular, from the viewpoint of high chemical stability, all the second functional groups of the modifying agent may be alkyl groups.

The alkyl group as the second functional group may be an alkyl group having 1 to 5 carbon atoms, more specifically an alkyl group having 1 to 4 carbon atoms. The alkyl group contained in the substituted amino group may be linear or branched. Examples of the alkyl group contained in the substituted amino group may include a methyl group, an ethyl group, an n-propyl group, an n-butyl group, an isopropyl group, an isobutyl group, a sec-butyl group, a tert-butyl group, and the like.

The number of second functional groups in the modifying agent may be an integer of 1 or more. When the number of first functional groups in the modifying agent is 1, the number of second functional groups in the modifying agent may be 3. Further, when the number of first functional groups in the modifying agent is 2, the number of second functional groups in the modifying agent may be 2. The plurality of second functional groups contained in the modifying agent may be the same or different.

In the modifying agent, examples of the atom to which the first functional group and the second functional group are directly bonded may include a C atom, a silicon (Si) atom, a germanium (Ge) atom, and a tetravalent metal atom. Here, examples of the tetravalent metal atom may include a titanium (Ti) atom, a zirconium (Zr) atom, a hafnium (Hf) atom, a molybdenum (Mo) atom, a tungsten (W) atom, and the like. Further, the atom to which the first functional group and the second functional group are directly bonded may be a metal atom that can be bonded to four or more ligands, in addition to the tetravalent metal atom. In this case, the number of second functional groups can be increased, so that a strong effect as an inhibitor can be exhibited.

As the atom to which the first functional group and the second functional group are directly bonded, any one of the C atom, the Si atom, and the Ge atom may be used among those described above. This is because when any of the C atom, the Si atom, and the Ge atom is used as the atom to which the first functional group and the second functional group are directly bonded, at least one selected from the group of the high adsorptivity of the modifying agent on the first surface and the high chemical stability of the modifying agent after the adsorption on the first surface, that is, residues derived from the modifying agent, can be obtained. Among these, more specifically, the Si atom may be used as the atom to which the first functional group and the second functional group are directly bonded. This is because when the Si atom is used as the atom to which the first functional group and the second functional group are directly bonded, both of the high adsorptivity of the modifying agent on the first surface and the high chemical stability of the modifying agent after the adsorption on the first surface, that is, residues derived from the modifying agent, can be obtained. As described above, the first functional group and the second functional group are directly bonded to the atom to which the first functional group and the second functional group are directly bonded, but in addition to these, a hydrogen (H) atom or a third functional group may be bonded thereto.

The third functional group bonded to the atom to which the first functional group and the second functional group are directly bonded may be any functional group other than the above-mentioned functional groups as the first functional group and the second functional group. Examples of the third functional group may include functional groups formed by appropriately combining two or more of a C atom, a Si atom, a Ge atom, a tetravalent metal atom, a metal atom capable of being bonded to four or more ligands, an O atom, a N atom, and a H atom.

The modifying agent contains one or more atoms to which the first functional group and the second functional group are directly bonded in one molecule, but may contain two or more atoms to which the first functional group and the second functional group are directly bonded in one molecule. Hereinafter, the atom to which the first functional group and the second functional group are directly bonded is also referred to as an atom X for the sake of convenience.

The modifying agent may include a structure containing a tetravalent atom to which the first functional group and the second functional group are directly bonded. Above all, specifically, the modifying agent may include a structure containing a tetravalent atom to which only the first functional group and the second functional group are directly bonded. Above all, more specifically, the modifying agent may include a structure containing one Si to which only the first functional group and the second functional group are directly bonded. That is, the modifying agent may include a structure in which only the first functional group and the second functional group are directly bonded to Si as the center atom.

The modifying agent may include a structure containing one amino group in one molecule. Above all, specifically, the modifying agent may include a structure containing one amino group and at least one alkyl group in one molecule. Above all, more specifically, the modifying agent may include a structure containing one amino group and three alkyl groups in one molecule. Further, the modifying agent may include a structure in which one amino group is bonded to Si which is the center atom. Above all, specifically, the modifying agent may include a structure in which one amino group and at least one alkyl group are bonded to Si which is the center atom. Above all, more specifically, the modifying agent has a structure in which one amino group and three alkyl groups are bonded to Si which is the center atom. As described above, the amino group may be a substituted amino group. The substituents contained in the substituted amino group are as described above.

As the modifying agent, for example, a compound represented by the following formula (1) may be used.

$$[R^1]n^1\text{—}(X)\text{-}[R^2]m^1 \quad \text{Formula (1):}$$

In the formula (1), $R^1$ represents a first functional group that is directly bonded to X, $R^2$ represents a second functional group or a H atom that is directly bonded to X, X represents a tetravalent atom selected from the group consisting of a C atom, a Si atom, a Ge atom, and a tetravalent metal atom, $n^1$ represents 1 or 2, and $m^1$ represents 2 or 3.

The first functional group represented by $R^1$ may mean same as the above-mentioned first functional group, and the same applies to the examples. When $n^1$ is 2, two les may be the same or different. The second functional group represented by $R^2$ may mean same as the above-mentioned second functional group, and the same applies to the examples. When $m^1$ is 2 or 3, two or three $R^2$s may include one or two H atoms and the rest may be second functional groups, or all may be second functional groups. When all of the two or three $R^2$s are second functional groups, all the second functional groups may be the same or different. The Si atom may be used as the tetravalent atom represented by X. $n^2$ may be 1. $m^2$ may be 3.

Examples of the modifying agent may include (dimethylamino)trimethylsilane ($(CH_3)_2NSi(CH_3)_3$, abbreviation: DMATMS), (diethylamino)triethylsilane ($(C_2H_5)_2NSi(C_2H_5)_3$, abbreviation: DEATES), (dimethylamino)triethylsilane ($(CH_3)_2NSi(C_2H_5)_3$, abbreviation: DMATES), (diethylamino)trimethylsilane ($(C_2H_5)_2NSi(CH_3)_3$, abbreviation: DEATMS), (trimethylsilyl)amine ($(CH_3)_3SiNH_2$, abbreviation: TMSA), (triethylsilyl)amine ($(C_2H_5)_3SiNH_2$, abbreviation: TESA), (dimethylamino)silane ($(CH_3)_2NSiH_3$, abbreviation: DMAS), (diethylamino)silane ($(C_2H_5)_2NSiH_3$, abbreviation: DEAS), and the like.

Further, examples of the modifying agent may include bis(dimethylamino)dimethylsilane ($[(CH_3)_2N]_2Si(CH_3)_2$, abbreviation: BDMADMS), bis(diethylamino)diethylsilane ($[(C_2H_5)_2N]_2Si(C_2H_5)_2$, abbreviation: BDEADES), bis(dimethylamino)diethyl silane ($[(CH_3)_2N]_2Si(C_2H_5)_2$, abbreviation: BDMADES), bis(diethylamino)dimethylsilane ($[(C_2H_5)_2]_2Si(CH_3)_2$, abbreviation: BDEADMS), bis(dimethylamino)silane ($[(CH_3)_2]_2SiH_2$, abbreviation: BDMAS), bis(dimethylaminodimethylsilyl)ethane ($[(CH_3)_2N(CH_3)_2Si]_2C_2H_6$, abbreviation: BDMADMSE), bis(dipropylamino)silane ($[(C_3H_7)_2N]_2SiH_2$, abbreviation: BDPAS), bis(dipropylamino)dimethylsilane ($[(C_3H_7)_2N]_2Si(CH_3)_2$, abbreviation: BDPADMS), bis(dipropylamino)diethylsilane ($(C_3H_7)_2N]_2Si(C_2H_5)_2$, abbreviation: BDPADES), (dimethylsilyl)diamine ($(CH_3)_2Si(NH_2)_2$, abbreviation: DMSDA), (diethylsilyl)diamine ($(C_2H_5)_2Si(NH_2)_2$, abbreviation: DESDA), (dipropylsilyl)diamine ($(C_3H_7)_2Si(NH_2)_2$, abbreviation: DP SDA), bis(dimethylaminodimethylsilyl)methane ($[CH_3)_2N(CH_3)_2Si]_2CH_2$, abbreviation: BDMADMSM), bis(dimethylamino)tetramethyldisilane ($[(CH_3)_2N]_2(CH_3)_4Si_2$, abbreviation: BDMATMDS), and the like.

All of these are organic compounds including a structure in which an amino group and an alkyl group are directly bonded to Si. These compounds may also be referred to as an aminoalkyl compound or an alkylamino compound. One or more of these compounds can be used as the modifying agent.

Step D

After performing step C, a film-forming agent is supplied to the wafer 200 to form a film on the surface of the SiN film which is the second surface. That is, the film-forming agent reacting with the surface of the SiN film is supplied to the wafer 200 to selectively (preferentially) form a film on the surface of the SiN film. Specifically, the following steps D1 and D2 are sequentially executed. In the following example, the film-forming agent includes a precursor, an oxidizing agent, and a catalyst. In steps D1 and D2, the output of the heater 207 is adjusted so that the temperature of the wafer 200 is maintained at a state of being equal to or lower than the temperature of the wafer 200 in steps A, B, and C. Specifically, as shown in FIG. 4, the temperature of the wafer 200 is maintained at a state of being lower than the temperature of the wafer 200 in steps A, B, and C.

Step D1

In this step, the precursor (precursor gas) and the catalyst (catalyst gas) are supplied as a film-forming agent to the wafer 200 after performing step C, that is, the wafer 200 after selectively forming the film-formation inhibiting layer on the surface of the SiO film which is the first surface.

Specifically, the valves 243*b* and 243*d* are opened to allow the precursor and the catalyst to flow into the gas supply pipes 232*b* and 232*d*, respectively. The flow rates of the precursor and the catalyst are adjusted by the MFCs 241*b* and 241*d*, respectively, and the precursor and the catalyst are supplied into the process chamber 201 via the nozzles 249*b* and 249*a*, respectively, mixed in the process chamber 201, and exhausted through the exhaust port 231*a*. In this operation, the precursor and the catalyst are supplied to the wafer 200 from the side of the wafer 200 (precursor+catalyst supply). At this time, the valves 243*f* to 243*h* may be opened to allow an inert gas to be supplied into the process chamber 201 via the nozzles 249*a* to 249*c*, respectively.

By supplying the precursor and the catalyst to the wafer 200 under the process conditions to be described later, it is possible to selectively chemisorbing at least a portion of the molecular structure of molecules constituting the precursor on the surface of the SiN film which is the second surface while suppressing the chemisorption of at least the portion of the molecular structure of the molecules constituting the precursor on the surface of the SiO film which is the first surface. As a result, a first layer is selectively formed on the surface of the SiN film. The first layer contains at least a portion of the molecular structure of the molecules constituting the precursor, which is residues of the precursor. That is, the first layer contains at least some of atoms constituting the precursor.

In this step, by supplying the catalyst together with the precursor, it is possible to proceed with the above-mentioned reaction in a non-plasma atmosphere and under low temperature conditions as will be described later. In this way, by forming the first layer in the non-plasma atmosphere and under the low temperature conditions as will be described later, it is possible to maintain molecules and atoms constituting the film-formation inhibiting layer formed on the surface of the SiO film without extinguishing (desorbing) them from the surface of the SiO film.

Further, by forming the first layer in the non-plasma atmosphere and under the low temperature conditions as will be described later, the precursor can be prevented from being thermally decomposed (gas phase-decomposed), that is, self-decomposed, in the process chamber 201. As a result, it is possible to prevent multiple deposition of at least a portion of the molecular structure of molecules constituting the precursor on the surface of the SiO film and the surface of the SiN film and selectively adsorb the precursor on the surface of the SiN film.

In this step, at least a portion of the molecular structure of the molecules constituting the precursor may be adsorbed on a portion of the surface of the SiO film, but an amount of adsorption thereof is very small, which is much smaller than an amount of adsorption of at least a portion of the molecular structure of the molecules constituting the precursor on the surface of the SiN film. Such selective (preferential) adsorption is possible because the process conditions in this step are the low temperature conditions as will be described later and the conditions that the precursors do not undergo gas phase decomposition in the process chamber 201. Further, this is also possible because the film-formation inhibiting layer is formed over the entire region of the SiO film, whereas the film-formation inhibiting layer is not formed in many regions on the surface of the SiN film.

The process conditions for supplying the precursor and the catalyst in step D1 are exemplified as follows.

Processing temperature: room temperature (25 degrees C.) to 120 degrees C., specifically room temperature to 90 degrees C.

Processing pressure: 133 Pa, specifically 1,333 Pa

Precursor supply flow rate: 0.001 to 2 slm

Catalyst supply flow rate: 0.001 to 2 slm

Inert gas supply flow rate (for each gas supply pipe): 0 to 20 slm

Each gas supply time: 1 to 60 seconds

After selectively forming the first layer on the surface of the SiN film which is the second surface, the valves 243*b* and 243*d* are closed to stop the supply of the precursor and the catalyst into the process chamber 201, respectively. Then, a gaseous substance and the like remaining in the process chamber 201 are removed from the process chamber 201 (purging) according to the same processing procedure and process conditions as in the purging in step A. The processing temperature for purging in this step may be set to the same as the processing temperature for supplying the precursor and the catalyst.

An example of the precursor may include a Si- and halogen-containing gas. Halogen includes chlorine (Cl), fluorine (F), bromine (Br), iodine (I), and the like. The Si- and halogen-containing gas contains halogen in the form of a chemical bond between Si and halogen. The Si- and halogen-containing gas may further contain C, in which C may be contained in the form of a Si—C bond. An example of the Si- and halogen-containing gas may include a silane-based gas containing Si, Cl, and an alkylene group and having a Si—C bond, that is, an alkylenechlorosilane-based gas. The alkylene group includes a methylene group, an ethylene group, a propylene group, a butylene group, and the like. The alkylenechlorosilane-based gas may contain Cl in the form of a Si—Cl bond and C in the form of a Si—C bond.

Examples of the Si- and halogen-containing gas may include an alkylenechlorosilane-based gas such as bis(trichlorosilyl)methane ($(SiCl_3)_2CH_2$, abbreviation: BTCSM) gas or 1,2-bis(trichlorosilyl)ethane ($(SiCl_3)_2C_2H_4$, abbreviation: BTCSE) gas, alkylchlorosilane-based gas such as 1,1,2,2-tetrachloro-1,2-dimethyldisilane ($(CH_3)_2Si_2Cl_4$, abbreviation: TCDMDS) gas or 1,2-dichloro-1,1,2,2-tetramethyldisilane ($(CH_3)_4Si_2Cl_2$, abbreviation: DCTMDS) gas, a gas including a cyclic structure composed of Si and C and containing halogen, such as 1,1,3,3-tetrachloro-1,3-disilacyclobutane ($C_2H_4Cl_4Si_2$, abbreviation: TCDSCB) gas, and the like. Further, an example of the Si- and halogen-containing gas may include an inorganic chlorosilane-based gas such as tetrachlorosilane ($SiCl_4$, abbreviation: STC) gas, hexachlorodisilane ($Si_2Cl_6$, abbreviation: HCDS) gas, or octachlorotrisilane ($Si_3Cl_8$, abbreviation: OCTS) gas. One or more of these gases can be used as the precursor.

Further, as the precursor, instead of the Si- and halogen-containing gas, it may be possible to use, e.g., an aminosilane-based gas such as tetrakis(dimethylamino)silane ($Si[N(CH_3)_2]_4$, abbreviation: 4DMAS) gas, tris(dimethylamino)silane ($Si[N(CH_3)_2]_3H$, abbreviation: 3DMAS) gas, bis(diethylamino)silane ($Si[N(C_2H_5)_2]_2H_2$, abbreviation: BDEAS) gas, bis(tert-butylamino)silane ($SiH_2[NH(C_4H_9)]_2$, abbreviation: BTBAS) gas, or (diisopropylamino)silane ($SiH_3[N(C_3H_7)_2]$, abbreviation: DIPAS) gas. One or more of these gases can be used as the precursor.

Examples of the catalyst may include the same catalysts as the various catalysts exemplified in the above-described step B.

Step D2

After step D1 is completed, the oxidizing agent (oxidizing gas) and the catalyst (catalyst gas) are supplied as a film-forming agent to the wafer 200, that is, the wafer 200 after the first layer is selectively formed on the surface of the SiN film which is the second surface.

Specifically, the valves 243*c* and 243*d* are opened to allow the oxidizing agent and the catalyst to flow into the gas supply pipes 232*c* and 232*d*, respectively. The flow rates of the oxidizing agent and the catalyst are adjusted by the MFCs 241*c* and 241*d*, respectively, and the oxidizing agent and the catalyst are supplied into the process chamber 201 via the nozzles 249*c* and 249*a*, respectively, mixed in the process chamber 201, and exhausted through the exhaust port 231*a*. In this operation, the oxidizing agent and the catalyst are supplied to the wafer 200 from the side of the wafer 200 (oxidizing agent+catalyst supply). At this time, the valves 243*f* to 243*h* may be opened to allow an inert gas to be supplied into the process chamber 201 via the nozzles 249*a* to 249*c*, respectively.

By supplying the oxidizing agent and the catalyst to the wafer 200 under the process conditions to be described later, it is possible to oxidize at least a portion of the first layer formed on the surface of the SiN film, which is the second surface, in step D1. As a result, a second layer formed by oxidizing the first layer is formed on the surface of the SiN film.

In this step, by supplying the catalyst together with the oxidizing agent, it is possible to proceed with the above-mentioned reaction in a non-plasma atmosphere and under low temperature conditions as will be described later. In this way, by forming the second layer in the non-plasma atmosphere and under the low temperature conditions as will be described later, it is possible to maintain molecules and atoms constituting the film-formation inhibiting layer formed on the surface of the SiO film which is the first surface without extinguishing (desorbing) them from the surface of the SiO film.

In this step, an O- and H-containing gas can be used as the oxidizing agent. When the oxidizing agent is the O- and H-containing gas, the conditions for supplying the O- and H-containing gas and the catalyst in step B may be set to be different from the conditions for supplying the oxidizing agent (that is, the O- and H-containing gas) and the catalyst in step D2. In particular, the time (processing time) for supplying the O- and H-containing gas and the catalyst in step B may be set to be longer than the time (processing time) for supplying the oxidizing agent (that is, the O- and H-containing gas) and the catalyst in step D2. This makes it possible to more effectively remove F adsorbed on the surface of the wafer 200 after performing step A, and to more effectively form an OH termination on the surface of the SiO film.

The process conditions for supplying the oxidizing agent+ the catalyst in step D2 are exemplified as follows.

Processing temperature: room temperature (25 degrees C.) to 120 degrees C., specifically room temperature to 100 degrees C.

Processing pressure: 133 to 1,333 Pa

Oxidizing agent supply flow rate: 0.001 to 2 slm

Catalyst supply flow rate: 0.001 to 2 slm

Inert gas supply flow rate (for each gas supply pipe): 0 to 20 slm

Each gas supply time: 1 to 60 seconds

After changing (converting) the first layer formed on the surface of the SiN film, which is the second surface, into the second layer by oxidation, the valves 243*c* and 243*d* are closed to stop the supply of the oxidizing agent and the catalyst into the process chamber 201, respectively. Then, a gaseous substance and the like remaining in the process chamber 201 are removed from the process chamber 201 (purging) according to the same processing procedure and process conditions as in the purging in step A. The processing temperature for purging in this step may be set to the same as the processing temperature for supplying the oxidizing agent and the catalyst.

Examples of the oxidizing agent may include the same O- and H-containing gases as the various O- and H-containing gases exemplified in the above-described step A. Further, as the oxidizing agent, an oxygen (O)-containing gas can be used in addition to the O- and H-containing gas. Examples of the O-containing gas may include $O_2$ gas, ozone ($O_3$) gas, nitrous oxide ($N_2O$) gas, nitric oxide (NO) gas, nitrogen dioxide ($NO_2$) gas, carbon monoxide (CO) gas, carbon dioxide ($CO_2$) gas, and the like. In addition to these gases, as the oxidizing agent, a cleaning liquid, for example, a cleaning liquid containing ammonia water, hydrogen peroxide water, and pure water may be used. That is, oxidation may be performed by APM cleaning. In this case, the wafer 200 can be oxidized by exposing it to the cleaning liquid. One or more of these gases can be used as the oxidizing agent.

Examples of the catalyst may include the same catalysts as the various catalysts exemplified in the above-described step B.

[Performing Predetermined Number of Times]

Figure 5E:
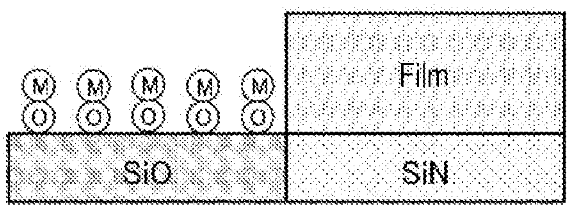
FIG. 5E is a schematic cross-sectional view showing the wafer surface portion after a film is selectively formed on the surface of the SiN film by performing step D from the state of FIG. 5D.

By performing a cycle a predetermined number of times (n time, where n is an integer of 1 or more), the cycle including non-simultaneously, that is, without synchronization, performing the above-described steps D1 and D2, a film can be selectively (preferentially) formed on the surface of the SiN film which is the second surface of the wafer 200, as shown in FIG. 5E. For example, when the above-mentioned precursor, oxidizing agent, and catalyst are used, a SiOC film or a SiO film can be selectively grown as the film on the surface of the SiN film. The above cycle may be repeated a plurality of times. That is, the thickness of the second layer formed per cycle may be set to be smaller than a desired film thickness, and the above cycle may be repeated multiple times until the thickness of a film formed by stacking second layers reaches the desired film thickness.

As described above, by repeating the above cycle a plurality of times, the film can be grown on the surface of the SiN film which is the second surface. At this time, since the film-formation inhibiting layer is formed on the surface of the SiO film which is the first surface, it is possible to suppress the growth of the film on the surface of the SiO film. That is, by repeating the above cycle a plurality of times, it is possible to promote the growth of the film on the surface of the SiN film while suppressing the growth of the film on the surface of the SiO film.

Further, when steps D1 and D2 are performed, since the film-formation inhibiting layer formed on the surface of the SiO film is maintained on the surface of the SiO film, as described above, the growth of the film on the surface of the SiO film can be suppressed. However, when the formation of the film-formation inhibiting layer on the surface of the SiO film is insufficient for some reason, the formation and growth of the film on the surface of the SiO film may occur very slightly. However, even in this case, the thickness of the film formed on the surface of the SiO film which is the first surface is much thinner than the thickness of the film formed on the surface of the SiN film which is the second surface. As used herein, "high selectivity in selective growth" means to include not only a case where a film is formed only on the second surface with no film formed on the first surface, but also a case where a very thin film is formed on the first surface but a much thicker film is formed on the second surface.

Steps A, B, C, and D may be performed in the same process chamber (in-situ). As a result, after the surface of the wafer 200 is cleaned by step A (after the native oxide film is removed), steps B, C, and D can be performed without the wafer 200 being exposed to the atmosphere, that is, with the surface of the wafer 200 kept in a clean state. This makes it possible to appropriately perform selective formation of a film on the surface of the SiN film. That is, by performing steps A, B, C, and D in the same process chamber (in-situ), it is possible to perform selective growth with high selectivity.

(Step E)

After performing step D, heat treatment is performed on the wafer 200, that is, the wafer 200 after selectively forming the film on the surface of the SiN film which is the second surface. At this time, the output of the heater 207 is adjusted so that the internal temperature of the process chamber 201, that is, the temperature of the wafer 200 after selectively forming the film on the surface of the SiN film, may be set to be equal to or higher than the temperature of the wafer 200 in steps A, B, C, and D, specifically to be higher than the temperature of the wafer 200 in steps A, B, C, and D.

By performing heat treatment (annealing treatment) on the wafer 200, impurities contained in the film formed on the surface of the SiN film in step D can be removed and defects in the film can be repaired. In case of not having to remove impurities or repair defects in the film formed on the surface of the SiN film, the annealing treatment can be omitted. Further, this step may be performed in a state where the inert gas is supplied into the process chamber 201, or may be performed in a state where a reactive substance such as an oxidizing agent (oxidizing gas) is supplied into the process chamber 201. In this case, the inert gas and the reactive substance such as the oxidizing agent (oxidizing gas) are also referred to as an assist substance.

The process conditions for heat treatment in step E are exemplified as follows.

Processing temperature: 120 to 1,000 degrees C., specifically 400 to 700 degrees C.

Processing pressure: 1 to 120,000 Pa

Processing time: 1 to 18,000 seconds

Assist substance supply flow rate: 0 to 50 slm (After-Purging and Returning to Atmospheric Pressure)

After step E is completed, an inert gas acting as a purge gas is supplied into the process chamber 201 from each of the nozzles 249*a* to 249*c* and is exhausted through the exhaust port 231*a*. Thus, the interior of the process chamber 201 is purged and a gas, reaction by-products, and the like remaining in the process chamber 201 are removed from the interior of the process chamber 201 (after-purging). After that, the internal atmosphere of the process chamber 201 is replaced with an inert gas (inert gas replacement) and the internal pressure of the process chamber 201 is returned to the atmospheric pressure (returning to atmospheric pressure).

(Boat Unloading and Wafer Discharging)

After that, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219*s* is moved and the lower end opening of the manifold 209 is sealed by the shutter 219*s* via the O-ring 220*c* (shutter close). The processed wafers 200 are unloaded from the reaction tube 203 and are then discharged from the boat 217 (wafer discharging).

(3) Effects of the Present Embodiment

According to the present embodiment, one or more of the following effects may be achieved.

By performing step A of supplying the F-containing gas to the wafer 200 including the first surface and the second surface and step B of supplying the O- and H-containing gas and the catalyst to the wafer 200 after performing step A, it is possible to efficiently remove F adsorbed on the surface of the wafer 200 in step B and further to efficiently and selectively (preferentially) form the OH termination on the first surface in step B. As a result, it is possible to selectively (preferentially) modify the first surface in step C, thereby selectively (preferentially) forming a film on the second surface in step D.

Further, step B may be performed under the condition that the formation of the OH terminal on the second surface is suppressed and the OH terminal is formed on the first surface. Further, step B may be performed under the condition that the oxidation of the second surface is suppressed and the OH termination is formed on the first surface. Further, step B may be performed under the condition that the amount of OH termination formed on the second surface is smaller than the amount of OH termination formed on the first surface. By performing step B under these conditions, the OH termination can be selectively formed on the first surface, thereby selectively (preferentially) modifying the first surface in step C. As a result, it is possible to selectively (preferentially) form a film on the second surface in step D.

Since the film-forming agent includes the precursor, the oxidizing agent, and the catalyst, a film can be selectively (preferentially) formed on the second surface at a low temperature in step D. Therefore, it is possible to prevent the outermost surface of the first surface modified by the modifying agent in step C from being deteriorated (for example, the function of the film-formation inhibiting layer is disabled) by the film-forming agent. Further, in step D, the cycle including non-simultaneously performing step D1 of supplying the precursor or the precursor and the catalyst to the wafer 200 and step D2 of supplying the oxidizing agent and the catalyst to the wafer 200 may be performed a predetermined number of times. By doing so, in step D, since a film can be selectively (preferentially) formed on the second surface at a low temperature, it is possible to prevent the outermost surface of the first surface modified by the modifying agent in step C from being deteriorated (for example, the function of the film-formation inhibiting layer is disabled) by the film-forming agent.

When the oxidizing agent used in step D2 is the O- and H-containing gas, the conditions for supplying the O- and H-containing gas and the catalyst in step B may be set to be different from the conditions for supplying the oxidizing agent (O- and H-containing gas) and the catalyst in step D2. In particular, the time for supplying the O- and H-containing gas and the catalyst in step B may be set longer than the time for supplying the oxidizing agent (O- and H-containing gas) and the catalyst in step D2. By doing so, it is possible to more effectively remove F adsorbed on the surface of the wafer 200 by performing step A, and to more effectively form the OH termination on the surface of the SiO film.

By performing steps A, B, C, and D in the same process chamber (in-situ), after removing the native oxide film on the surface of the wafer 200 in step A, steps B, C, and D can be performed without the wafer 200 being exposed to the atmosphere, that is, while maintaining a state in which there is no native oxide film on the surface of the wafer 200. As a result, it is possible to appropriately perform selective formation of a film on the surface of the SiN film, thereby making it possible to perform selective growth with high selectivity. Further, by performing steps A, B, C, D, and E in the same process chamber (in-situ), in addition to obtaining the above-mentioned effects, it is possible to heat-treat (anneal) the film selectively formed on the surface of the SiN film without being exposed to the atmosphere. As a result, it is possible to enhance the annealing effect on the film, and it is possible to make the annealed film a film that is not easily affected by atmospheric exposure.

By performing steps A, B, C, and D on the wafer 200 whose first surface contains an oxygen-containing material (oxide) and whose second surface contains an oxygen-free material (non-oxide), it is possible to more appropriately generate the above-mentioned various types of reactions, so that the above-mentioned effects can be remarkably obtained. Further, by performing steps A, B, C, and D on the wafer 200 whose first surface contains a silicon- and oxygen-containing material (silicon oxide) and whose second surface contains a silicon-containing material (silicon non-oxide) which is oxygen-free), it is possible to furthermore appropriately generate the above-mentioned various types of reactions, so that the above-mentioned effects can be more remarkably obtained. Further, by performing steps A, B, C, and D on the wafer 200 whose first surface contains a silicon- and oxygen-containing material (silicon oxide) and whose second surface contains a silicon- and nitrogen-containing material (silicon nitride), it is possible to furthermore appropriately generate the above-mentioned various types of reactions, so that the above-mentioned effects can be more remarkably obtained.

When the F-containing gas in step A is HF gas and the O- and H-containing gas in step B is $H_2O$ gas, it is possible to more appropriately remove the above-mentioned native oxide film, form the OH termination on the first surface, etc., so that the above-mentioned effects can be remarkably obtained.

(4) Modifications

The substrate processing sequence in the present embodiment can be changed as in the following modifications. These modifications can be used in proper combination. Unless otherwise stated, the processing procedures and process conditions in each step of each modification can be the same as the processing procedures and process conditions in each step of the above-described substrate processing sequence.

Modification 1

In the processing sequence shown in FIG. 4, an example in which step B is performed after step A is performed has been described, but step B may be performed at the same time as step A. That is, step B may be performed after step A is performed as in the above embodiment, or may be performed at the same time as step A as in this modification. When step B is performed at the same time as step A, the F-containing gas, the O- and H-containing gas, and the catalyst are simultaneously supplied to the wafer 200. In this modification, by performing step B at the same time as step A, it is possible to shorten the time for performing step A and step B. When step B is performed after the step A is performed as in the above-described embodiment, it is possible to more effectively perform each of step A and step B.

When step B is performed at the same time as step A, step A may be started prior to step B. That is, after step A is started, step B may be started while step A is being continued. In this case, it is possible to more effectively perform step than when step A and step B are started at the same time.

When step B is performed at the same time as step A, step A may be completed prior to step B. That is, after step A and step B are performed at the same time, step A may be completed while step B is being continued. In this case, it is possible to more effectively perform step B than when step A and step B are completed at the same time.

Like these, when step B is performed at the same time as step A, it suffices to have at least a timing or period for performing step B at the same time as step A, and it suffices to start and/or complete step A prior to step B.

Modification 2

As in the processing sequence shown below, in step D1, the precursor may be supplied alone as a reactive gas to the wafer 200 without supplying the catalyst to the wafer 200. Further, in step D2, the oxidizing agent may be supplied alone as a reactive gas to the wafer 200 without supplying the catalyst to the wafer 200. By supplying the precursor and the catalyst to the wafer 200, the chemical adsorption of at least a portion of the molecular structure of the molecules constituting the precursor on the second surface can be promoted at a low temperature. Further, by supplying the oxidizing agent and the catalyst to the wafer 200, the oxidation rate can be increased at a low temperature. However, when the chemical adsorption reaction of at least a portion of the molecular structure of the molecules constituting the precursor on the second surface, when the oxidation rate is adjusted according to the process conditions such as the processing temperature and the processing pressure, etc., the supply of the catalyst can be omitted. This modification can also obtain the same effects as the above-described embodiment.

F-containing gas→O- and H-containing gas+Catalyst→Modifying agent→(Precursor→Oxidizing agent+Catalyst)×*n*→Heat treatment F-containing gas→O- and H-containing gas+Catalyst→Modifying agent→(Precursor+Catalyst→Oxidizing agent)×*n*→Heat treatment F-containing gas→O- and H-containing gas+Catalyst→Modifying agent→(Precursor→Oxidizing agent)×*n*→Heat treatment Modification 3

As in the processing sequence shown below, step E (heat treatment) in the above-described embodiment may be omitted. If the amount of impurities and the like contained in the film formed on the second surface is within an allowable range, step E can be omitted. This modification also obtain the same effects as the above-described embodiment. Further, by omitting step E, it is possible to shorten the total processing time, thereby improving the productivity.

F-containing gas→O- and H-containing gas+Catalyst→Modifying agent→(Precursor+Catalyst→Oxidizing agent+Catalyst)×*n*

Modification 4

When a process for the purpose of optimizing an adsorption site on the surface of the wafer 200 is performed, steps C, D, and E in the above-described embodiment may be omitted as in the processing sequence shown below. In this case, as a substrate processing process which is a process of manufacturing a semiconductor device, step A of supplying the F-containing gas to the wafer 200 and step B of supplying the O- and H-containing gas and the catalyst to the wafer 200 after performing step A are performed. In this modification, in step A, the native oxide film formed on the surface of the wafer 200 is removed, and in step B, F adsorbed on the surface of the wafer 200 after performing step A is removed, thereby forming the OH termination on the surface of the wafer 200. According to this modification, in step B, F adsorbed on the surface of the wafer 200 by step A can be efficiently removed, and further, the OH terminal can be efficiently formed on the surface of the wafer 200. That is, according to this modification, it is possible to control and optimize the adsorption sites on the surface of the wafer 200.

F-containing gas→O- and H-containing gas+Catalyst

In this modification, as in the processing sequence shown below, step D of supplying the film-forming agent to the wafer 200 may be performed after step B is performed to the wafer 200. That is, in this modification, steps A, B, and D may be performed to the wafer 200. In step D, a film can be formed on the surface of the wafer 200 by supplying the film-forming agent reacting with the OH termination to the wafer 200. By performing step D, the film-forming agent can be supplied to the wafer 200 including a surface with an optimized adsorption site, which makes it possible to properly form a film on the surface of the wafer 200. As a result, it is possible to improve the interface characteristics between the film and the surface of the wafer 200.

F-containing gas→O- and H-containing gas+Catalyst→(Precursor+Catalyst→Oxidizing agent+Catalyst)×$n$ The same film-forming agent as the various of types of film-forming agents exemplified in the above-mentioned step D can be used as the film-forming agent used in this modification. In particular, for example, an aminosilane-based gas may be used as a precursor which is one of the film-forming agents.

Other Embodiments of the Present Disclosure

The embodiments of the present disclosure have been specifically described above. However, the present disclosure is not limited to the above-described embodiments, and various changes can be made without departing from the gist thereof.

For example, the wafer 200 may include a plurality of types of regions having different materials as the first surface, or may include a plurality of types of regions having different materials as the second surface. The regions constituting the first surface and the second surface may include, in addition to the above-mentioned SiO film and SiN film, films containing semiconductor elements, such as a SiOCN film, a SiON film, a SiOC film, a SiC film, a SiCN film, a SiBN film, a SiBCN film, a SiBC film, a Si film, a Ge film, and a SiGe film, films containing metal elements, such as a TiN film and a W film, an amorphous carbon film (a-C film), a single crystal Si (Si wafer), etc. Any region can be used as the second surface as long as it is a region where a native oxide film can be formed. On the other hand, any region can be used as the first surface as long as it is a region where a native oxide film is difficult to be formed. Even in that case, the same effects as the above-described embodiment can be obtained.

For example, in step D, in addition to the SiOC film and the SiO film, a silicon-based oxide film such as a silicon oxycarbonitride film (SiOCN film), a silicon oxynitride film (SiON film), a silicon oxyboronitride film (SiBON film), or a silicon oxyborocarbonitride film (SiBOCN film) may be formed. Further, in step D, for example, a metal-based oxide film such as an aluminum oxide film (AlO film), a titanium oxide film (TiO film), a hafnium oxide film (HfO film), or a zirconium oxide film (ZrO film) may be formed.

Recipes used in each process may be prepared individually according to the processing contents and may be stored in the memory 121*c* via a telecommunication line or the external memory 123. Moreover, at the beginning of each process, the CPU 121*a* may properly select an appropriate recipe from the recipes stored in the memory 121*c* according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-prepared ones but may be prepared, for example, by changing the existing recipes that are already installed in the substrate processing apparatus. In the case of changing the recipes, the changed recipes may be installed in the substrate processing apparatus via a telecommunication line or a recording medium storing the recipes. In addition, the existing recipes already installed in the existing substrate processing apparatus may be directly changed by operating the input/output device 122 of the substrate processing apparatus.

An example in which a film is formed using a batch-type substrate processing apparatus capable of processing a plurality of substrates at a time has been described in the above-described embodiments. The present disclosure is not limited to the above-described embodiments, but may be suitably applied, for example, to a case where a film is formed using a single-wafer type substrate processing apparatus capable of processing a single substrate or several substrates at a time. In addition, an example in which a film is formed using a substrate processing apparatus installed with a hot-wall-type process furnace has been described in the above-described embodiments. The present disclosure is not limited to the above-described embodiments, but may be suitably applied to a case where a film is formed using a substrate processing apparatus installed with a cold-wall-type process furnace.

Even in the case of using these substrate processing apparatuses, each process may be performed according to the same processing procedures and process conditions as those in the above-described embodiments, and the same effects as the above-described embodiments are achieved.

The above-described embodiments may be used in proper combination. The processing procedures and process conditions used in this case may be the same as, for example, the processing procedures and process conditions in the above-described embodiments.

EXAMPLES

<Wafer Preparation>

A wafer including the surface of a SiO film and the surface of a SiN film, which has not been subjected to DHF cleaning, was prepared. Since this wafer has not been subjected to DHF cleaning, it has a native oxide film on the surface of the SiN film, as shown in FIG. 5A.

Comparative Example 1

Using the above-described substrate processing apparatus, step D in the processing sequence of the above-described embodiment was performed on the wafer to form a SiOC film on the wafer, and an evaluation sample of Comparative Example 1 was prepared. The process conditions in step D when preparing the evaluation sample of Comparative Example 1 were set to predetermined conditions within the range of the process conditions in step D of the processing sequence of the above-described embodiment.

Comparative Example 2

Using the above-described substrate processing apparatus, steps C and D in the processing sequence of the above-described embodiment were performed on the wafer to form a SiOC film on the wafer, and an evaluation sample of Comparative Example 2 was prepared. The process conditions in each step when preparing the evaluation sample of Comparative Example 2 were set to predetermined conditions within the range of the process conditions in each step of the processing sequence of the above-described embodiment.

Comparative Example 3

Using the above-described substrate processing apparatus, steps A, C, and D in the processing sequence of the above-described embodiment were performed on the wafer to form a SiOC film on the wafer, and an evaluation sample of Comparative Example 3 was prepared. The process conditions in each step when preparing the evaluation sample of Comparative Example 3 were set to predetermined conditions within the range of the process conditions in each step of the processing sequence of the above-described embodiment.

Figure 6:
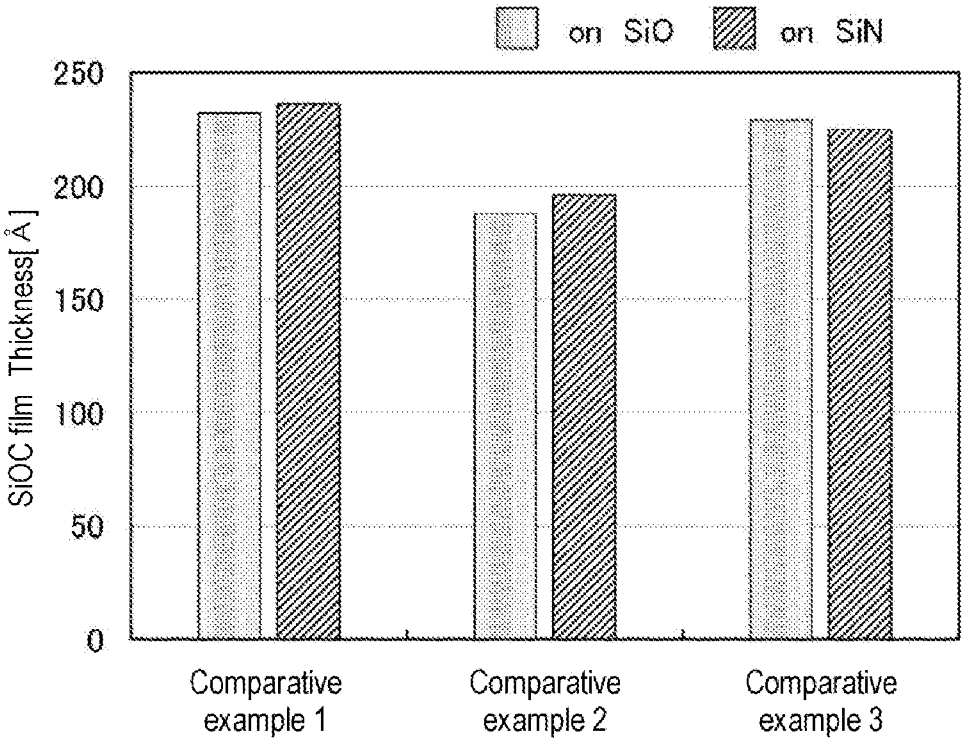
FIG. 6 is a graph showing evaluation results in Comparative Examples.

After preparing the evaluation samples of Comparative Examples 1 to 3, the thickness of the SiOC film formed on the surface of the SiO film and the thickness of the SiOC film formed on the surface of the SiN film in each evaluation sample were measured. The measurement results are shown in FIG. 6. In FIG. 6, the horizontal axis represents Comparative Example 1, Comparative Example 2, and Comparative Example 3 in order from the left, and the vertical axis represents the thickness [A] of the SiOC film formed on each surface. In the bar graph, a bar on the left side shows the thickness of the SiOC film formed on the surface of the SiO film, and a bar on the right side shows the thickness of the SiOC film formed on the surface of the SiN film.

It can be seen from FIG. 6 that all of the evaluation samples of Comparative Examples 1 to 3 has a difference of about several A to ten plus several A between the thickness of the SiOC film formed on the surface of the SiO film and the thickness of the SiOC film formed on the surface of the SiN film, showing low selectivity in selective growth.

Embodiment Example 1

Using the above-described substrate processing apparatus, steps A, B, C, and D in the processing sequence of the above-described embodiment were performed on the wafer to form a SiOC film on the wafer, and an evaluation sample of Embodiment Example 1 was prepared. The process conditions in each step when preparing the evaluation sample of Embodiment Example 1 were set to predetermined conditions within the range of the process conditions in each step of the processing sequence of the above-described embodiment.

Reference Example 1

Using the above-described substrate processing apparatus, steps A, B, C, and D in the processing sequence of the above-described embodiment were performed on the wafer to form a SiOC film on the wafer, and an evaluation sample of Reference Example 1 was prepared. The process conditions in steps A, C, and D when preparing the evaluation sample of Reference Example 1 were set to predetermined conditions within the range of the process conditions in steps A, C, and D of the processing sequence of the above-described embodiment. Further, in step B when preparing the evaluation sample of Reference Example 1, a catalyst was not supplied, only an O- and H-containing gas was supplied as a reactive gas, and a processing pressure thereof was set to be higher than the processing pressure in step D (specifically, step D2). Specifically, the processing pressure was set to a predetermined pressure in the range of 13,300 to 66,500 Pa. The process conditions other than the processing pressure in step B were set to predetermined conditions within the range of the process conditions in step B of the processing sequence of the above-described embodiment.

Figure 7:
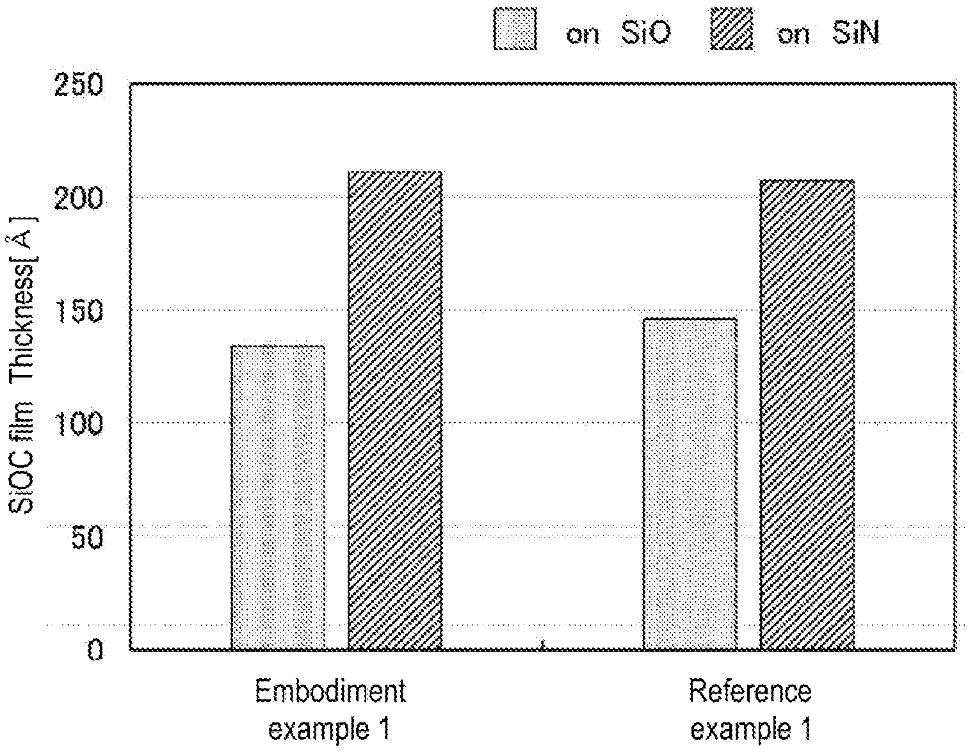
FIG. 7 is a graph showing evaluation results in Embodiment Example and Reference Example.

After preparing the evaluation samples of Embodiment Example 1 and Reference Example 1, the thickness of the SiOC film formed on the surface of the SiO film and the thickness of the SiOC film formed on the surface of the SiN film in each evaluation sample were measured. The measurement results are shown in FIG. 7. In FIG. 7, the horizontal axis represents Embodiment Example 1 and Reference Example 1 in order from the left, and the vertical axis represents the thickness [A] of the SiOC film formed on each surface. In the bar graph, a bar on the left side shows the thickness of the SiOC film formed on the surface of the SiO film, and a bar on the right side shows the thickness of the SiOC film formed on the surface of the SiN film.

It can be seen from FIG. 7 that the evaluation sample of Embodiment Example 1 has a difference of about 80 Å between the thickness of the SiOC film formed on the surface of the SiO film and the thickness of the SiOC film formed on the surface of the SiN film, showing very high selectivity in selective growth. Further, it can be seen that the evaluation sample of Reference Example 1 also has a difference of about 60 Å between the thickness of the SiOC film formed on the surface of the SiO film and the thickness of the SiOC film formed on the surface of the SiN film, showing high selectivity in selective growth. Further, in both Embodiment Example 1 and Reference Example 1, it can be seen that the thickness of the SiOC film formed on the surface of the SiO film can be reduced to zero by reducing the number of cycles in step D which corresponds to a thickness of the SiOC film formed on the surface of the SiO film, showing that the SiOC film can be selectively formed on the SiN film among the SiO film and the SiN film.

Although the various embodiments of the present disclosure have been specifically described above, the present disclosure also includes the following aspects.

Supplementary Note 1

According to another aspect of the present disclosure, there is provided a method of manufacturing a semiconductor device or a method of processing a substrate, including:

(a) supplying a fluorine-containing gas to a substrate; and (b) supplying an oxygen- and hydrogen-containing gas and a catalyst to the substrate after performing (a).

Supplementary Note 2

The method of Supplementary Note 1, further including:

(c) supplying a film-forming agent to the substrate after performing (b).

Supplementary Note 3

The method of Supplementary Note 2, wherein in (a), a native oxide film formed on the surface of the substrate is removed, wherein in (b), fluorine adsorbed on the surface of the substrate is removed and an OH termination is formed on the surface of the substrate, and wherein in (c), a film is formed on the substrate by supplying the film-forming agent reacting with the OH termination.

Supplementary Note 4

According to another aspect of the present disclosure, there is provided a substrate processing apparatus including:

a process chamber in which a substrate is processed;

a fluorine-containing gas supply system configured to supply a fluorine-containing gas to the substrate in the process chamber;

an oxygen- and hydrogen-containing gas supply system configured to supply an oxygen- and hydrogen-containing gas to the substrate in the process chamber;

a catalyst supply system configured to supply a catalyst to the substrate in the process chamber; and a controller configured to be capable of controlling the fluorine-containing gas supply system, the oxygen- and hydrogen-containing gas supply system, and the catalyst supply system so as to perform each process (each step) of Supplementary Note 1 in the process chamber.

Supplementary Note 5

According to another aspect of the present disclosure, there is provided a program that causes, by a computer, a substrate processing apparatus to execute each procedure (each step) of Supplementary Note 1 or a computer-readable recording medium storing the program.

According to the present disclosure in some embodiments, it is possible to selectively form a film on a desired surface.

While certain embodiments have been described, these embodiments have been presented by way of example and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

(a) supplying a fluorine-containing gas to the substrate including a first surface and a second surface;

(b) supplying an oxygen- and hydrogen-containing gas and a catalyst to the substrate after performing (a);

(c) supplying a modifying agent to the substrate after performing (b); and (d) supplying a film-forming agent to the substrate after performing (c), wherein the fluorine-containing gas is HF gas, and the oxygen- and hydrogen-containing gas is $H_2O$ gas.

2. The method of claim 1, wherein in (a), a native oxide film formed on the second surface is removed, and wherein in (b), fluorine adsorbed on a surface of the substrate is removed and an OH termination is formed on the first surface.

3. The method of claim 1, wherein (b) is performed under a condition that formation of an OH termination on the second surface is suppressed and an OH termination is formed on the first surface.

4. The method of claim 1, wherein (b) is performed under a condition that oxidation of the second surface is suppressed and an OH termination is formed on the first surface.

5. The method of claim 1, wherein (b) is performed under a condition that an amount of OH termination formed on the second surface is smaller than an amount of OH termination formed on the first surface.

6. The method of claim 1, wherein in (c), the first surface is modified to form a film-formation inhibiting layer by adsorbing at least a portion of a molecular structure of molecules constituting the modifying agent on the first surface.

7. The method of claim 1, wherein in (d), a film is formed on the second surface.

8. The method of claim 1, wherein the film-forming agent includes a precursor, a catalyst, and an oxidizing agent.

9. The method of claim 8, wherein (d) includes performing a cycle a predetermined number of times, the cycle including non-simultaneously performing:

(d1) supplying the precursor or the precursor and the catalyst to the substrate; and (d2) supplying the oxidizing agent and the catalyst to the substrate.

10. The method of claim 9, wherein the oxidizing agent is an oxygen- and hydrogen-containing gas, and wherein a condition for supplying the oxygen- and hydrogen-containing gas and the catalyst in (b) is set to be different from a condition for supplying the oxidizing agent and the catalyst in (d2).

11. The method of claim 9, wherein the oxidizing agent is an oxygen- and hydrogen-containing gas, and wherein a time for supplying the oxygen- and hydrogen-containing gas and the catalyst in (b) is set to be longer than a time for supplying the oxidizing agent and the catalyst in (d2).

12. The method of claim 1, wherein (a), (b), (c), and (d) are performed in a same process chamber.

13. The method of claim 1, wherein (b) is performed:

simultaneously with performing (a);

after performing (a); or simultaneously with and after performing (a).

14. The method of claim 1, wherein (a) is started prior to (b).

15. The method of claim 1, wherein (a) is completed prior to (b).

16. The method of claim 1, wherein the first surface contains an oxygen-containing material, and the second surface contains an oxygen-free material.

17. A method of manufacturing a semiconductor device comprising the method of claim 1.

* * * * *